(12) United States Patent
Kozodoy

(10) Patent No.: US 8,634,686 B2
(45) Date of Patent: Jan. 21, 2014

(54) LIGHT-TRACKING OPTICAL DEVICE AND APPLICATION TO LIGHT CONCENTRATION

(75) Inventor: Peter Kozodoy, Palo Alto, CA (US)

(73) Assignee: Glint Photonics, Inc., Palo Alto, CA (US)

( * ) Notice: Subject to any disclaimer, the term of this patent is extended or adjusted under 35 U.S.C. 154(b) by 353 days.

(21) Appl. No.: 13/215,271

(22) Filed: Aug. 23, 2011

(65) Prior Publication Data

US 2012/0056081 A1    Mar. 8, 2012

Related U.S. Application Data

(60) Provisional application No. 61/402,968, filed on Sep. 7, 2010.

(51) Int. Cl.
*G02B 6/26* (2006.01)
(52) U.S. Cl.
USPC .................. 385/39; 385/31; 385/900
(58) Field of Classification Search
None
See application file for complete search history.

(56) References Cited

U.S. PATENT DOCUMENTS

| | | | |
|---|---|---|---|
| 7,672,549 B2 | 3/2010 | Ghosh et al. | |
| 7,817,885 B1 | 10/2010 | Moore et al. | |
| 2003/0012483 A1* | 1/2003 | Ticknor et al. | 385/16 |
| 2003/0210848 A1* | 11/2003 | Troll | 385/16 |
| 2011/0108110 A1* | 5/2011 | Kusuura | 136/259 |

FOREIGN PATENT DOCUMENTS

| | | |
|---|---|---|
| WO | WO 2010/033859 A2 | 3/2010 |
| WO | WO 2010/056382 A1 | 5/2010 |

* cited by examiner

*Primary Examiner* — Mike Stahl
(74) *Attorney, Agent, or Firm* — Patent Law Office of David G. Beck

(57) ABSTRACT

An automatic optical coupling device that uses liquid to couple focused light into a light-guide is described. The liquid moves within a chamber or layer via the thermocapillary effect in order to automatically track and couple a moving spot of focused light. Also provided is the application of these coupling devices in an array feeding into a common light-guide, optical designs to improve the performance of these arrays, and the application of such arrays to light collection.

64 Claims, 29 Drawing Sheets

_US 8,634,686 B2_

LIGHT-TRACKING OPTICAL DEVICE AND APPLICATION TO LIGHT CONCENTRATION

CROSS REFERENCE TO RELATED APPLICATIONS

This application claims benefit of the filing date of U.S. Provisional Patent Application Ser. No. 61/402,968, filed on Sep. 7, 2010 and titled "Light-Tracking Waveguide Couplers and Application to Solar Light Concentration", which is incorporated herein for any and all purposes.

TECHNICAL FIELD

The present invention relates to optics, specifically to optical systems for coupling focused light into a light-guide.

BACKGROUND

The coupling of light into a light-guide is a common requirement in optical systems employed in a range of applications including telecommunications, illumination, diagnostics, and solar energy collection. Light-guides generally include a core region of high refractive index surrounded by a cladding region of lower refractive index (which may be air or vacuum). Light rays that undergo total internal reflection at the interface between these two regions are trapped within the light-guide and can be routed along the light-guide to desired output locations. Light-guides are often fabricated as fibers or as planar slabs, but can also be formed in other geometries. Light is introduced into the light-guide at one or more coupling locations, where the light rays can be captured into guided modes of the light-guide. Often, light is focused onto the coupling location so that a high intensity of light can enter the guide at a small coupling location. For high-efficiency light coupling, precise alignment of the focused light to the coupling location is required. The need for precise alignment of an optical system adds considerable expense and complication to the assembly process. Furthermore, the system alignment must be re-established if the incoming light changes in position or direction.

One use of light-guides is in solar energy concentrators that gather light from an array of concentrating lenses or mirrors and direct it onto a receiving element, such as a photovoltaic cell. These light-guide concentrator designs have an advantage compared to traditional solar concentrating optics in that individual receivers need not be positioned at the focal point of each concentrating lens; instead, a single receiver can be positioned at the end of the light-guide to receive the collected light from many concentrating elements. In one prior art light-guide concentrator design, disclosed in U.S. Pat. No. 7,672,549, an array of concentrating elements is positioned above a light-guide. At the focal point of each concentrating element, a coupling site includes a mirrored facet in the light-guide that redirects the focused light so that it is captured by the light-guide. In order to couple this light into the light-guide without also incurring some loss of light captured from other lenses, the modal volume of the light-guide is increased at each coupling site. Similar prior art light-guide concentrator designs are disclosed in U.S. Pat. No. 7,817,885 and International Application No. PCT/US2009/034630, both of which describe concentrators featuring a sheet of concentrating lenses above a stepped or planar light-guide, with reflecting surfaces located at the focal points of the lenses in order to couple the focused light into the light-guide. A fourth prior art light-guide concentrator design, disclosed in International Application No. PCT/US2009/057567 and illustrated in FIG. 1a, also uses a planar light-guide 11 of constant modal volume and an array of concentrating elements 12. Coupling sites 14 are provided with a mechanism to reorient the concentrated light rays 13 so that they couple into guided modes of the light-guide. As illustrated in FIG. 1b, one design provided for a coupling site 14 is a sawtooth "fold" mirror 15 fabricated on the light-guide in a small area at the focus of each lens. This fold mirror 15 is constructed with a 120° sawtooth design to deflect a normally incident cone of light rays 13 by +60° or −60° so that they will couple into the light-guide. The need for precise optical alignment in each of these concentrator systems complicates their manufacture. In cases where the light source is not stationary, for example in the collection of solar light, the systems are repositioned during operation by a mechanical tracker (not shown), which can be connected to or incorporated into the systems, in order to follow the motion of the light source (i.e., the sun, in the case of solar light collection). If the concentrator is not properly oriented with respect to the angle of incident light, the spot of focused light will no longer fall on the coupling mirror 15 and therefore will not be captured by the light-guide.

Passive solar trackers have been designed using materials that move or change shape due to differential heating in the sun. Exemplary materials include evaporative liquids, bimetallic strips, and shape memory alloy. These systems are powered by incident sunlight and mechanically re-orient the entire solar energy system to face the sun.

The field of microfluidics investigates devices in which small amounts of liquid are controllably moved within confined volumes; the term "optofluidics" is sometimes used to describe such devices designed to achieve optical effects. International Application No. PCT/US2009/057567 describes the use of optofluidics to provide automatic solar tracking in a planar concentrator design. The document describes a scheme in which the electric field of concentrated light was used to trap nanoscale particles suspended in a fluid, thereby raising the refractive index of the fluid at the location of focused light.

A mechanism that can be used to manipulate fluids is the thermocapillary effect, in which a temperature gradient is imposed upon a fluidic system. The surface tension of a fluid (or the interfacial tension between two immiscible or partially miscible fluids) is dependent on temperature, so a temperature gradient across a fluid surface or interface will result in uneven surface tension that produces a net force and causes fluid movement. When a thermal gradient is imposed upon a layer of fluid, the spatially varying tension causes convection to occur within the layer, and in a thin fluid film these forces can result in local thinning or even rupture of the film. When a thermal gradient is applied to a droplet, unequal tension on opposite sides of the droplet can cause it to migrate. Using this technique, a droplet may be moved within an air or vapor environment, a gas bubble may be moved within a liquid environment, or a liquid droplet may be moved within an immiscible or partially miscible fluid. Droplets and vapor bubbles can be stably captured at hot or cold spots. The direction and speed of fluid movement is a function of the temperature gradient, the geometry of the system, the contact angle of the liquid or liquids upon the surface or surfaces, the viscosity of the liquid or liquids, and the sign and magnitude of the change in interfacial tension with temperature.

The thermocapillary effect has been exploited to control fluid flow in some microfluidic devices. In various experiments, the temperature gradient generally was obtained either by using resistive heating elements or by shining light from a laser or high-intensity lamp onto an absorbing element or fluid. Large temperature gradients resulted in rapid movement of the fluid interface, and convection currents were generated in the bulk liquid or liquids.

SUMMARY

In one aspect, an apparatus configured to couple light into a light-guiding structure is described. The apparatus includes a fluid tracking layer located between a reorienting element and a light-guiding layer, the fluid tracking layer comprised of a cladding fluid layer and a coupling fluid layer. The light-guiding layer is capable of transporting light in a first direction through a bulk portion of the light-guiding layer. In the absence of a narrow light beam incident on the reorienting element, the cladding fluid layer is comprised of a continuous layer substantially free of any voids or apertures. In the presence of a narrow light beam incident on the reorienting element and forming a coupling location, the cladding fluid layer is comprised of an aperture at or adjacent to the coupling location. The aperture may be at least partially filled with coupling fluid of the coupling fluid layer.

In another aspect, an apparatus configured to couple light into a light-guiding structure is described. The apparatus includes a light-guiding layer capable of transporting light in a first direction through the light-guiding layer and a coupling region adjacent to or within the light-guiding layer and serving to couple incoming light into the light-guiding layer at a substantial angle relative to a propagation direction of the incoming light. The coupling region is located at or adjacent to a local temperature extremum within the light-guiding structure. The position of the coupling region can be adjusted by varying the location of the local temperature extremum.

In yet another aspect, an apparatus configured to couple incident light into a light-guiding structure is described. The apparatus includes a cladding fluid layer having a first refractive index adjacent to a light-guiding layer having a second refractive index. The light-guiding layer is capable of transporting light in a first direction through a bulk portion of the light-guiding layer. The apparatus further includes a coupling droplet having a third refractive index at least partially in the cladding fluid layer. The coupling droplet is formed of a fluid which is different from, and immiscible or partially miscible with, the fluid of the cladding fluid layer.

Implementations of the various apparatuses may include one or more of the following features. The apparatus can include a coupling fluid layer between the reorienting element and the light-guiding layer. The aperture can be filled or partially filled with coupling fluid of the coupling fluid layer. The cladding fluid layer can be between at least a portion of a coupling fluid layer and the light-guiding layer. The coupling fluid layer or the cladding fluid layer can be contained within a chamber having a chamber sidewall. The apparatus can further include a plurality of chambers, where each chamber includes a coupling fluid layer or a cladding fluid layer. At least a portion of the coupling fluid layer can be between the cladding fluid layer and the light-guiding layer. The coupling fluid layer in combination with the light-guiding layer can serve to guide light through the light-guiding structure, the guided light being transported through the bulk portion of the light-guiding layer and through a bulk portion of the coupling fluid layer. The apparatus can further include an absorbing fluid layer between the reorienting element and the light-guiding layer. The coupling fluid layer is comprised of a first fluid and the cladding fluid layer is comprised of a second fluid that is immiscible or partially miscible with the first fluid. The coupling fluid and the cladding fluid may be selected from the group of materials consisting of aqueous solutions, water-soluble fluids, hydrocarbon oils, silicone oils, organic compounds, and fluorocarbon oils. The light-guiding layer can have a first refractive index; the cladding fluid of the cladding fluid layer can have a second refractive index which is less than the first refractive index; and the coupling fluid of the coupling fluid layer can have a third refractive index which is greater than the second refractive index. The reorienting element can be configured to deflect the incident light beam into the light-guiding layer at a substantial angle relative to a propagation direction of the incident light beam. The light-guiding layer can include glass or a polymer. The reorienting element can be a reorienting layer. The reorienting layer can reflect or refract incident light. Different portions of the reorienting layer can be configured to deflect incident light at different angles. The reorienting layer can be formed of a substantially non-porous material. A surface of at least one of the reorienting layer and the light-guiding layer can be coated with a coating that changes a wetting property of the surface. The reorienting layer can be a transmissive layer, and can be configured to be positioned between the light-guiding layer and the incident focused light. The reorienting layer can include a prism array. The reorienting layer can be a reflective layer which includes a sawtooth mirror. The sawtooth mirror can be configured to couple incident light that is tilted away from perpendicular incidence by an average angle α into the light-guiding layer, such that individual mirrors of the sawtooth mirror form angles of 30°±α/2 relative to a plane of the reorienting layer. The coupling region can be located at or adjacent to a local temperature extremum within the light-guiding structure. A portion of the incident focused light can be absorbed at or adjacent to the coupling location. The absorption of the incident focused light can result in a local temperature maximum at or adjacent to the coupling location. The light coupled into the light-guiding structure can be sunlight or laser light.

The local temperature extremum can be a local temperature maximum. The local temperature maximum can result from heating by absorption of the incoming light. The incoming light can be focused incoming light or laser light. The coupling region can be self-aligned with the focused incoming light or laser light. A cross-sectional area of the coupling region can be substantially smaller than a cross-sectional area of the light-guiding layer. The light-guiding layer can include a fluid containing one or more reorienting elements. The apparatus can further include a cladding wall layer contacting a side of the light-guiding layer. The reorienting elements can be droplets or bubbles. The apparatus can further include a device configured to accept the light transported through the light-guiding layer after it exits the light-guiding layer. The device can be a photovoltaic cell or a photodetector. The device can be configured to accept light of a range of wavelengths, with the light-guiding layer being largely transparent to light having a wavelength within the range of wavelengths. The apparatus can further include a fluid tracking layer adjacent to the light-guiding layer. The fluid tracking layer can include one fluid or two or more immiscible or partially miscible fluids. The coupling region can be at least partially within the fluid tracking layer. The fluid tracking layer can include a cladding fluid layer having a lower refractive index than a refractive index of the light-guiding layer. The apparatus can further include a reorienting element serving to reorient light which is coupled into the light-guiding structure. The apparatus can further include a focusing element serving to focus light which is coupled into the light-guiding structure. The focusing element can include one or more lenses or one or more mirrors. The focusing element can include a plurality of lenses or mirrors, with the lenses or mirrors being arrayed along a curved surface. A device can include at least two segments, each of the at least two segments including or being formed of any of the apparatuses. The at least two segments can be coupled to each other and configured in varying orientations. The light-guiding structure can be planar or curved.

The coupling droplet can move through the cladding fluid layer. The refractive index of the light-guide layer and the refractive index of the coupling fluid can each be greater than the refractive index of the cladding fluid. The apparatus can be configured such that the incident light is coupled into the light-guiding layer at a substantial angle relative to a propagation direction of the incident light. The apparatus can further include a reorienting element serving to reorient light which is coupled into the light-guiding structure. The reorienting element can be a reorienting layer. The coupling droplet can further serve to redirect the incident light. The cladding fluid layer can be contained within a chamber having a chamber sidewall. The apparatus can further include a plurality of chambers, where each chamber includes a coupling droplet. The apparatus can further include an absorbing layer. The absorbing layer can be a fluid absorbing layer. The light-guiding layer can be a fluid light-guiding layer. The apparatus can further include a wall layer contacting the fluid light-guiding layer. The wall layer can be a cladding layer having a refractive index which is smaller than the refractive index of the fluid light-guiding layer. The wall layer can be an additional light-guiding layer having a refractive index which is about the same as or greater than the refractive index of the fluid light-guiding layer. The coupling droplet can be at least partially in the fluid light-guiding layer. A thickness of the cladding fluid layer can vary throughout the layer. The light-guiding structure can be curved. The apparatus can further include one or more lenses configured to focus the incident light. A focal plane of at least one of the one or more lenses can be curved, and the light-guiding structure can lie along the curved focal plane of the at least one of the one or more lenses.

In yet another aspect, a coupling device which provides a self-aligning mechanism for low-loss coupling of focused light into a light-guide is provided. The device uses microfluidic chambers containing one or more liquids. Coupling into the light-guide may occur only over a small portion or portions of the light-guide area, while the remainder of the area provides low-loss propagation of guided light. The coupling sites can automatically align with the location of the focused light via the thermocapillary effect, a physical phenomenon which produces fluid movement as a result of surface or interface tension variation due to local temperature changes. Partial absorption of the focused light causes the formation of a local hot-spot and a surrounding temperature gradient, which drive the thermocapillary effect.

It is a further object of this invention to provide the application of arrays of such coupling devices on a common light-guide, matched with static focusing optics, to produce a tracking direct-beam optical energy collection system. The light-tracking movement of the coupling sites within the devices allows the optical system to adjust in order to capture direct-beam optical energy from a range of incidence angles. The invention also provides principles for designing both the static focusing optics and the complete system geometry in order to extend the range of incident light angles that can be captured by the array system. When used with direct-beam optical energy from the sun, this optical system provides a tracking solar energy collection system. The tracking solar energy collection system may be used either with or without an external mechanical tracking device. The automatic tracking provided by the coupling devices can reduce or eliminate the need for mechanical trackers, greatly reducing the cost of concentrating solar energy collection systems and simplifying the system design. The tracking direct-beam optical energy collection system may also be used to capture energy from other light sources, such as a laser beam used to transmit energy from a remote location.

In one implementation, an optical system that includes an array of fixed focusing lenses and a coupling device surrounding a central transparent light-guide (or light-guiding layer) is disclosed. The position and angular orientation of the lenses are varied across the array to provide efficient focusing and coupling of light into the light-guide at a broad range of incidence angles. Between the light-guide and the lens array, a layer of transparent material with lower index of refraction than the light-guide serves as cladding to confine light within the light-guide. The coupling device contains two immiscible or partially miscible liquids of different refractive indices that form a layered structure. The layer of liquid with low refractive index is adjacent to the light-guide, while the layer of liquid with higher refractive index is adjacent to a sawtooth reflecting surface located at the focal plane of the lens. The sawtooth surfaces reflect focused light from the lens, reorienting the rays so that they may pass into the guided modes of the light-guide. Direct-beam light passes through the lenses and the light-guide and is focused onto this reorienting layer. Local heating of the surface due to partial absorption of the focused light creates a temperature gradient, which causes the film of low refractive index fluid to thin and eventually rupture at the hot spot, while the film of high refractive index fluid thickens at the hot spot, coming into contact with the light-guide when the low refractive index fluid film ruptures. The liquid of high refractive index thereby enables the reflected light to couple into the light-guide at this coupling site, while at other locations the undisturbed low-index fluid layer provides light-guide cladding. If the hot spot is removed, or moved to another location, the interface tension between the two liquids will cause the layer structure to re-form. If the angle of incident light changes over time, the location of focused light will change and the coupling site will follow it due to the local heating always present at the location of focused light.

A further understanding of the nature and advantages of the present invention may be realized by reference to the remaining portions of the specification and the drawings.

DESCRIPTION OF DRAWINGS

FIG. 1b provides a cross-sectional view of a coupling mirror utilized in the light-guide solar concentrator of FIG. 1a.

Like reference symbols in the various drawings indicate like elements.

DETAILED DESCRIPTION

Figure 1A:
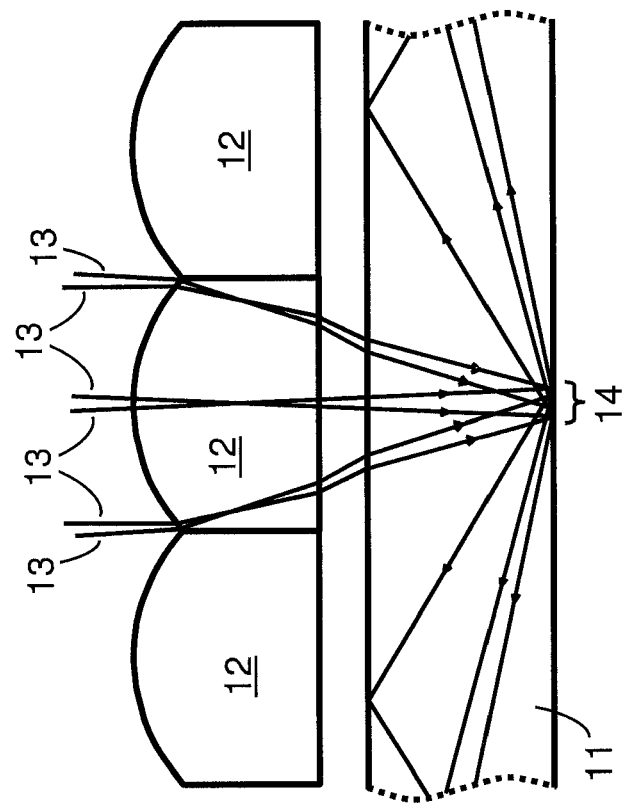
FIG. 1a provides a cross-sectional view of a light-guide solar concentrator of the prior art.

Described herein are devices which provide a self-aligning mechanism for low-loss coupling of a narrow beam of light (for example focused light or a narrow laser beam) into a light-guide. A narrow light beam is one with a substantially smaller cross sectional area, for example at least 5 times smaller, at least 10 times smaller, or at least 100 times smaller, than the surface of the device that the light beam is incident on. In some cases, the device is divided into or includes one or more chambers, and the narrow light beam has a substantially smaller cross sectional area, for example at least 5 times smaller, at least 10 times smaller, or at least 100 times smaller, than the surface of the chamber upon which it is incident. A number of implementations are described. Each implementation includes one or more of the following elements: (i) a light-guiding layer or layers which may be made of a solid, liquid, or gas, or combinations thereof, and is preferably largely transparent at the wavelengths of light that are desired for collection (i.e., the light-guiding layer does not substantially absorb the wavelength of light that is desired to be transported through the bulk of the light-guiding layer); (ii) a light-reorienting element or layer that reorients the focused incoming light rays so that they can be captured into the guided modes of the light-guiding layer; (iii) an absorbing medium, which may be one of the other layers described herein, that provides partial or complete absorption of the incident focused light and thereby generates local heating; and (iv) a tracking chamber or layer containing at least one fluid and where fluid movement is created by local heating. As used herein, a "fluid" is a non-rigid element or compound, typically a liquid or gas. Motion of a fluid can be characterized as viscous or non-viscous flow. In some implementations, the fluid movement created by local heating results from the thermocapillary effect. Implementations may also include additional elements such as specific means for focusing the incident or incoming light, one or more layers of material with low refractive index that serve as optical cladding for the light-guide, materials with specific thermal conductivity characteristics, and sidewalls within the tracking layer that divide the fluid into small chambers (the "chamber sidewalls"). The tracking coupling device designs can be applied to couple light from a single focused light source into a light-guide, or to couple light from an array of many such light sources into a common light-guide. The designs can be used with light-guides of various geometries, including planar light-guides and cylindrical fiber geometries. The descriptions and figures below focus on application to a planar light-guide fed by an array of close-packed focusing elements, but other applications of the same principles and designs are also possible. The figures are schematics intended to illustrate the operation of the device, and are not necessarily drawn to scale.

Coupling Device Designs with Retracting Cladding Fluid

Figure 2A:
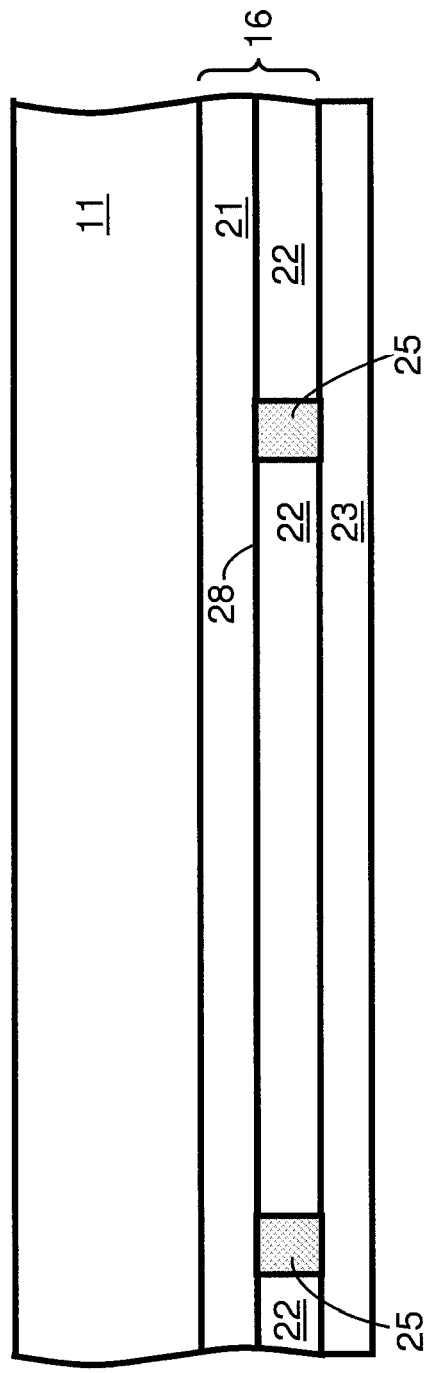
FIG. 2a provides a cross-sectional view of a coupling device with a retracting cladding fluid layer design and a reflective reorienting surface, shown in the absence of focused light.
Figure 2B:
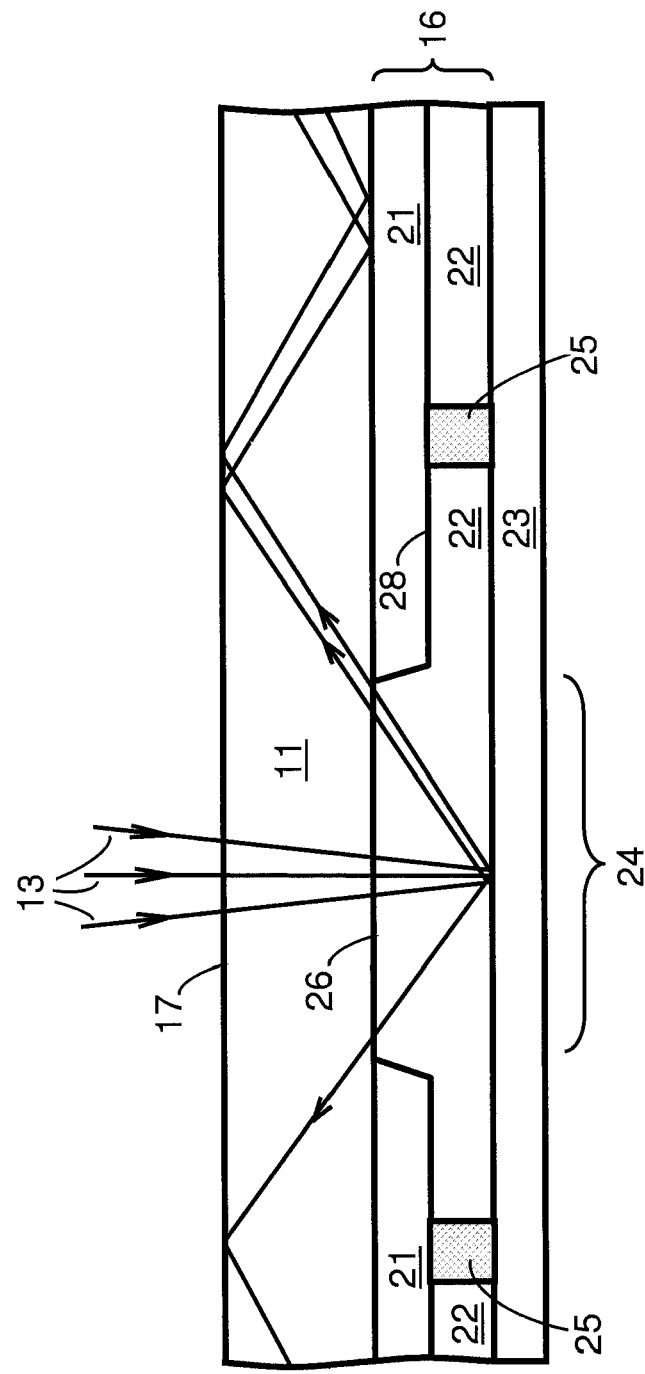
FIG. 2b provides a cross-sectional view of the coupling device shown in FIG. 2a in the presence of focused light.
Figure 2C:
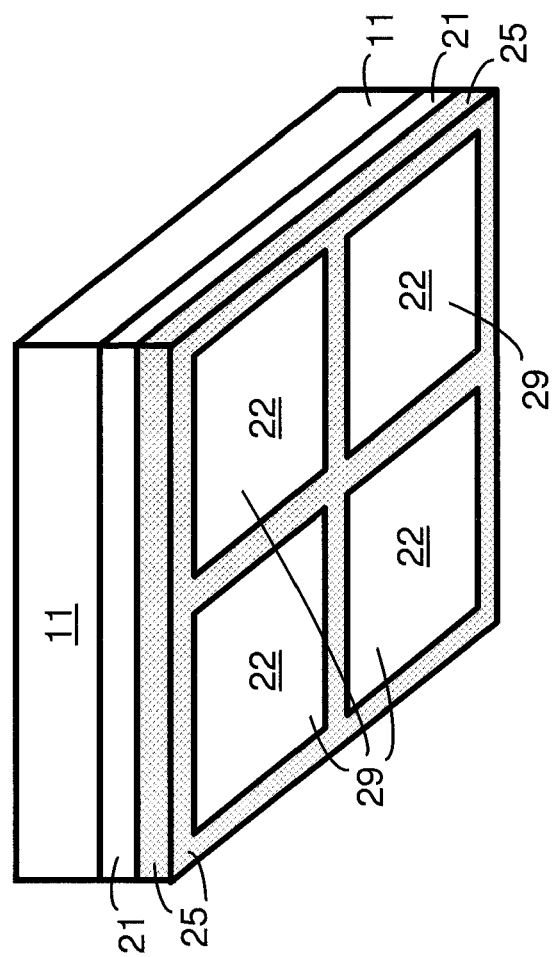
FIG. 2c provides a perspective view of the coupling device shown in FIG. 2a with the reorienting layer omitted for clarity.

As illustrated in FIGS. 2a, 2b, and 2c, an apparatus for coupling light into a light-guiding structure can include a multimode light-guide 11 (herein a light-guiding layer 11), a fluid tracking layer 16 located adjacent to the light-guiding layer 11, and an optically-active layer ("reorienting layer") 23 adjacent to the fluid tracking layer 16 that re-orients incident light rays so that they can enter the light-guiding layer 11 of the light-guiding structure. The light-guiding layer 11 is made of a material that is largely transparent at the wavelengths of light that will be captured and transported, or are desired to be transported, through a bulk portion of the light-guiding layer 11. That is, the light-guiding layer 11 may absorb less than 20%, less than 10%, less than 5%, or less than 1% of light that is transported through the light-guiding layer. Or, the light-guiding layer 11 may transport light to a device, such as a photovoltaic cell or a photodetector, which is configured to accept light of a range of wavelengths, and the light-guiding layer 11 absorbs less than 20%, less than 10%, less than 5%, or less than 1% of light within the given range of wavelengths that is transported through the light-guiding layer. Light-guiding layer 11 may, for example, be made of glass, or a transparent polymer such as plastic. The fluid tracking layer 16 is composed of two immiscible or partially miscible fluids that form a layered structure. The fluid adjacent to the light-guiding layer 11 is the "cladding fluid" 21 and is typically of lower refractive index than the light-guiding layer 11, in order to provide cladding to the light-guiding structure and keep guided light which is being transported through the light-guiding layer 11 confined, for example through total internal reflection. Fluid layer 22 is the "coupling fluid" and is typically of higher refractive index than the cladding fluid, and preferably has a refractive index which is about the same as or larger than that of the light-guiding layer 11. As illustrated in FIG. 2c, which is a perspective view of the apparatus of FIGS. 2a and 2b (with the reorienting layer 23 omitted for the sake of clarity), the coupling fluid layer 22 is separated into a plurality of chambers 29 with chamber sidewalls 25. While the chambers 29 are each shown to be directly contacting one another, there can be some spacing between each of the chambers, although the design of the apparatus is modified to accommodate spacing between chambers, as will be described below. The chambers 29 may be rectangular in shape, as shown in FIG. 2c, or be formed in any other shape (such as circles or hexagons).

Examples of immiscible or partially miscible fluids/liquids that could be used in the coupling fluid layer 22 or cladding fluid layer 21 are aqueous solutions, water-soluble fluids, hydrocarbon oils, silicone oils, organic compounds, and fluorocarbon oils. If the cladding fluid of cladding fluid layer 21 is an aqueous solution or a fluorocarbon oil it may feature a refractive index of approximately 1.3, while a coupling fluid of coupling fluid layer 22 of alkane or silicone oil may feature a refractive index between approximately 1.4 and 1.6. The focused light can be provided by optical elements that are external to the device, for example an array of lenses. The device design may be tailored to optimize coupling performance depending on the characteristics of the focused light source, as further described below.

The apparatus illustrated in FIGS. 2a, 2b, and 2c operates as follows. Referring to FIG. 2a, when no substantial amount of light is incident on the apparatus, and when the apparatus is not otherwise subject to any local heating or local temperature gradients that result in a local temperature maximum, the cladding fluid layer 21 is a continuous layer substantially free of any voids or apertures. The cladding fluid layer 21 hence provides optical cladding along the entire cross-sectional area over which the fluid tracking layer 16 contacts the light-guiding layer 11, such that substantially all light propagating through the light-guiding layer which is incident on the interface between the light-guiding layer 11 and the fluid tracking layer 16 is reflected back into the light-guiding layer 11.

Referring to FIG. 2b, a coupling location or coupling region 24 (herein a coupling location 24) is defined by a focused light beam 13 incident on the light-guiding structure. That is, any region in the light-guiding structure at which a focused light beam is incident is defined as a coupling location. As such, as the location(s) at which focused light is incident on the light-guiding structure varies, the position(s) of the coupling location(s) 24 varies accordingly.

When a focused beam of light 13 is incident on the light-guiding layer 11 from the side 17 opposite the fluid tracking layer 16, the light passes through the light-guiding layer 11 and through the entire thickness of the fluid tracking layer 16, and is reflected at a substantial angle from the incoming beam by the reorienting layer 23. As used herein, in reference to deflection of incoming light which is coupled into a light-guiding structure, a "substantial angle" is an angle sufficient for the light which enters the light-guiding layer to undergo total internal reflection and remain confined in the light-guiding layer as it propagates through the light-guiding structure. That is, in the absence of an element that reorients the incoming light, the incoming light may not be incident at an angle that allows for coupling into the light-guiding layer such that the light can be confined within the light-guiding layer through total internal reflection. Hence, a substantial angle is one which is at least large enough to insure that the light undergoes total internal reflection once it is coupled into the light-guiding layer. A portion of the incident light beam is absorbed, either in the light-guiding layer 11, in the fluid tracking layer 16 (i.e., in the cladding fluid layer 21 and/or coupling fluid layer 22), or by the reorienting layer 23, or in some combination of these layers, thereby causing local heating at the coupling location 24. The cladding fluid of the cladding fluid layer 21 is designed or configured to flow away from the hot spot, thereby resulting in an aperture being formed in the cladding fluid layer 21 at the coupling location 24, the aperture being filled with coupling fluid of the coupling fluid layer 22 (see FIG. 2b). Each coupling location is small compared to the total area of the interface between the fluid tracking layer 16 and the light-guiding layer 11. That is, at any given time, the total cross-sectional area of all interfaces 26 between the coupling fluid layer 22 and the light-guiding layer 11 at coupling locations 24 is substantially smaller than the total area of the interface between the fluid tracking layer 16 and the light-guiding layer 11. For example, the total cross-sectional area of all interfaces 26 can be less than 10%, less than 5%, less than 2%, or less than 1% of the total area of the interface between the fluid tracking layer 16 and the light-guiding layer 11. This ratio of areas is useful in that it results in only a substantially small amount of light propagating through the light-guiding layer 11 being able to leak out of the light-guiding layer 11.

Figure 1B:
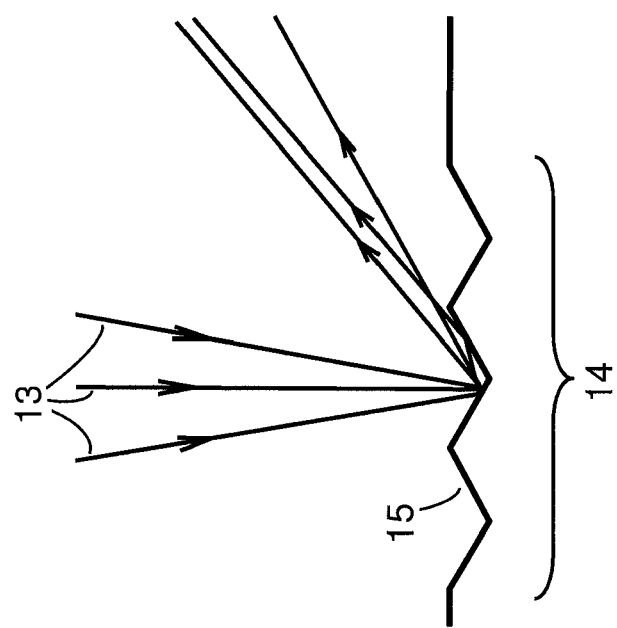

The reorienting layer 23 is located at or near the focal plane of the optics used to focus the incoming light, and focused light passes through the light-guiding layer 11 before striking the surface of the reorienting layer 23. The incident light rays 13 reflect off the surface and are deflected into angles designed to improve coupling into the guided modes of the light-guiding layer 11. Once properly re-oriented light rays enter the light-guiding layer 11, they undergo total internal reflection at the light-guiding layer/cladding layer interface and remain trapped in the light-guiding layer 11. The reorienting layer surface can be a diffuse or scattering reflector, a tailored angular reflector, or other reflecting surface. If an angular reflector is used, it can optionally employ the 120° sawtooth mirror design shown in FIG. 1b, which is optimized for focused light incident perpendicular to the light-guiding structure.

Figure 3:
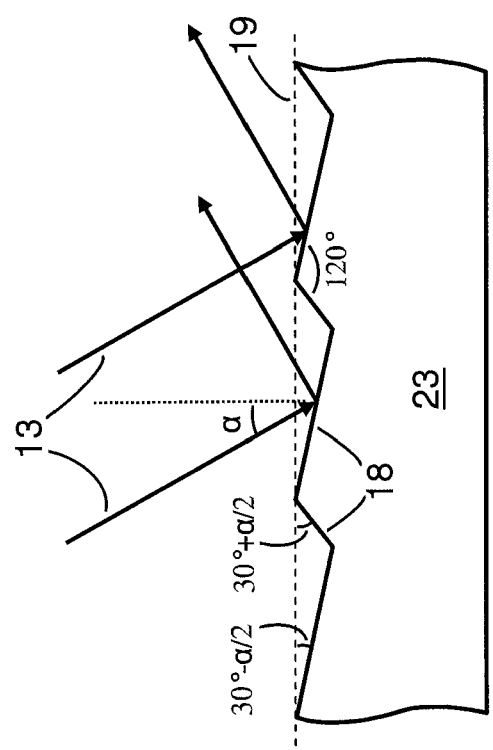
FIG. 3 provides a cross-sectional view of an example sawtooth minor reflective reorienting layer designed for light incident at average angle α.

Furthermore, the orientation of the mirrors along the surface of a single reorienting layer 23 can be varied to account for different incident angles of light. If the average angular orientation of the incident light varies in a predictable fashion across the reorienting layer, the orientation of the minors can be varied across the reorienting layer to optimize coupling in each location. That is, if the light-guiding structure is configured such that different locations along the light-guiding structure receive incoming focused light at different angles, with each location receiving incoming light at approximately the same angle each time light is incident on that location, the orientation of the mirrors at each location can be varied to insure that light is coupled into the light-guiding layer at an optimal angle at each coupling location 24. FIG. 3 shows an example sawtooth mirror reorienting layer 23 designed for incident light that is tilted away from perpendicular incidence by an average angle α. The angle between individual mirrors 18 remains 120°, but the mirrors are tilted toward the incident light cone, forming angles of 30°±α/2 to the plane 19 of the reorienting layer 23.

In addition to deflecting incident light at a desired angle, the reorienting layer 23 also serves to hold the fluids of the fluid tracking layer 16 in place, and to prevent the fluids from leaking out of the structure. The reorienting layer 23 can be made of any non-porous or substantially non-porous material that can effectively confine the fluids within the fluid tracking layer 16 and that provides the desired surface optical properties and wetting characteristics. For example, specular reflective surfaces may be created using a reflective metal such as aluminum, or using other materials, such as glass, plastic, or a polymer, covered with a reflective coating. Diffuse reflective surfaces may be created using materials featuring embedded light-scattering particles. The thermal conductivity of the reorienting layer 23 will affect the spatial temperature profile and therefore the thermocapillary response characteristics of the system. The choice of material for the reorienting layer can therefore provide a tool to optimize the thermocapillary response of the system.

Referring again to FIG. 2b, local heating at the coupling location 24 due to partial absorption of the focused light causes a change in interface tension between the two fluids of the fluid tracking layer 16, causing cladding fluid to flow away from the hot spot. This produces a local thinning of the cladding fluid layer 21 and can ultimately result in local rupture of the cladding fluid layer 21. Rupture of the cladding fluid layer 21 produces a high-refractive-index optical path through the coupling fluid at the coupling location 24, as shown in FIG. 2b. That is, light entering the light-guiding structure at the coupling location 24 passes only through high-refractive-index coupling fluid between the point at which it reflects off of the reorienting layer 23 and the point at which it enters the light-guiding layer 11, thereby entering the light-guiding layer 11 at an interface 26 between the light-guiding layer 11 and coupling fluid of the coupling fluid layer 22. If the refractive index of the coupling fluid is about the same as or greater than that of the light-guiding layer 11, the incident light 13 entering the light-guiding layer 11 from the coupling fluid layer 22 proceeds past the interface 26 at an angle relative to the surface of the interface 26 which is about the same as or less than the angle of the light ray in the coupling fluid relative to the interface 26 just prior to reaching the interface 26. Since the cladding fluid 21 has a lower refractive index than the material of the light-guiding layer 11, light coupled into the light-guiding layer 11 as described above (i.e., at a small angle relative to the interface 26) is mostly or completely reflected back into the light-guiding layer 11 every time it is incident on an interface between the light-guiding layer 11 and the cladding fluid layer 21.

The rupture of cladding fluid layer 21 need not be complete (not shown) in order to form a high-refractive-index optical path at coupling location 24. A very thin film of cladding fluid may remain on the surface of the light-guiding layer 11 at the coupling location 24, provided this remaining cladding fluid is sufficiently thin that it has a limited optical effect. That is, provided that light incident on interface 26 at a small angle can at least partially transit the thin cladding fluid layer and will not experience total internal reflection. Partial transmission through such thin low-refractive-index layers is known as evanescent coupling or frustrated total internal reflection, and can occur for layers substantially thinner than the wavelength of light. Hence the remaining thin film of cladding fluid can be substantially thinner than the smallest wavelength of light that the coupling device is configured to collect. For example, the thickness of the remaining film can be less than 50%, less than 25%, less than 10%, or less than 1% of the smallest wavelength of light that the coupling device is configured to collect.

When the focused light 13 is removed, the interface tension between the two fluids of the fluid tracking layer 16 causes cladding fluid to flow back into the thinned or ruptured area and reforms the original layer structure shown in FIG. 2a. Local thinning and/or rupturing of the cladding fluid will depend on the spatial temperature distribution, the interface tension between the two fluids and the dependence of that tension on temperature, and the initial thickness of the cladding fluid layer 21. The thickness of the cladding fluid layer 21 can therefore be designed as appropriate to optimize the performance of the overall system, provided it is thick enough to provide effective optical cladding for the optical wavelengths of interest. The cladding fluid layer 21 and the coupling fluid layer 22 can each be between about 0.1 microns and 100 microns thick, such as between 0.1 microns and 10 microns thick. Further, by using a non-planar chamber wall or a non-planar fluid interface, the thickness of the cladding fluid layer 21 can be varied across the chamber to provide different retracting properties in different locations, if desired. In addition, a wide variety of surfactants can be added to any or all of the fluid layers, which can dramatically affect the dependence of the interface tension on temperature.

The layered fluid structure of the fluid tracking layer 16 can be formed and stabilized using a variety of techniques, including fluid separation due to density variation as well as manipulation of the fluid tensions through the properties of the fluids and the chamber walls. For example, in this design, the surface of the light-guiding layer 11 that is in contact with the cladding fluid layer 21 may be designed so that it is preferentially wet by that fluid, while the reorienting layer 23 may be similarly designed so that it is preferentially wet by the coupling fluid. Preferential wetting on the surfaces can be achieved either by using materials for the light-guiding layer 11 and reorienting layer 23 that exhibit the desired wetting properties, or by coating the surface of those elements with coatings that change the wetting properties. Such coatings include fluorinated materials and other coatings that change the surface energy and wetting characteristics of a surface.

If the layered structure of the fluid tracking layer 16 is formed though manipulation of fluid tensions, it can be stabilized by dividing the fluid interface into discrete segmented areas (chambers) sufficiently small that fluid tension forces dominate over gravitational effects. The interface dimension below which fluid tension forces tend to dominate gravitational effects is known as the "capillary distance" and depends on the properties of the two fluids; it is typically between 100 microns and 1 cm. In order to stabilize the fluid layers via fluid tensions, the segmented interface areas should not significantly exceed this distance in any dimension. That is, the length and width of each chamber 29 in FIG. 2c can be less than 1 cm, such as less than 3 mm, between 100 microns and 1 cm, or between 100 microns and 3 mm. Alternatively, the chambers 29 may have a non-rectangular shape, with the longest chamber dimension being less than 1 cm, such as less than 3 mm, between 100 microns and 1 cm, or between 100 microns and 3 mm.

The segmentation can be achieved using chamber sidewalls 25, which protrude into the fluid tracking layer 16 and extend to the location of the fluid interface. The presence of the sidewalls permits the interface tension between the two fluids to maintain the layer structure across the chamber area. The sidewalls 25 may extend either from the surface of the light-guiding layer 11 to the interface 28 of the coupling fluid layer 22 and the cladding fluid layer 21 (not shown), or from the surface of the reorienting layer 23 to the interface 28 (as shown in FIGS. 2a and 2b). Alternatively, the sidewalls 25 can extend from the surface of the light-guiding layer 11 to the surface of the reorienting layer 23 (not shown), such that the coupling fluid layer 21 and the cladding fluid layer 22 are both contained within the chamber 29. In implementations where the chambers 29 are not directly contacting one another, i.e., there exists some spacing between adjacent chambers 29, the sidewalls 25 can extend from the surface of the light-guiding layer 11 all the way to the surface of the reorienting layer 23, thereby allowing for all fluid of the fluid tracking layer 16 to be contained by the sidewalls 25, the reorienting layer 23, and the light-guiding layer 11. If the sidewalls 25 contact the light-guiding layer 11, they can be constructed of a reflective or a low-refractive-index material in order to avoid loss of guided light. For example, the sidewalls 25 can have a refractive index that is less than that of the light-guiding layer 11 or is about the same as that of the cladding fluid layer 22. Depending upon the dimensions of the sidewalls and the relative volumes of the two fluids of the fluid tracking layer 16, the fluid interface may be planar (as shown in FIGS. 2a and 2b), or form a spherical cap.

The surface properties of the sidewalls 25 can influence the fluid behavior at the sidewalls. Providing the sidewalls 25 with a surface that is preferentially wetted by the fluid opposite the wall to which the sidewall is attached, as shown in FIGS. 2a and 2b, causes the fluid interface to terminate on the sidewall, and the interface tension between the two fluids maintains the layer structure across the chamber area. Alternatively, if the sidewall 25 is preferentially wet by the fluid adjacent to the wall to which the sidewall is attached, a thin wetting layer of that fluid may be present on the sidewall 25.

Chamber sidewalls 25 can be optionally omitted from the design, and the variation in surface properties that defines the segmentation can be patterned directly onto the walls of the fluid tracking layer 16 (not shown). For example, the walls of the fluid tracking layer 16 may feature areas that are preferentially wetted by one of the fluids, separated by border areas preferentially wetted by the other fluid, without the need for protruding sidewalls.

Regardless of the means of segmentation, the location of the chambers 29 can be made independent of the design or positions of the focusing elements, and the number of chambers 29 need not correspond one-to-one with the number of focusing elements, i.e., the number of focusing elements can be different than the number of chambers 29. Optical coupling can occur at more than one hot spot within a single chamber 29 if the optical system produces multiple focal points within a single chamber 29. If no focal points are present, then no optical coupling locations are produced and low-loss propagation of guided light occurs across the entire chamber area.

In order for automatic tracking to occur via the thermocapillary effect, some light can be absorbed to produce a local hot spot at the focal point. This light absorption can occur in one or more of the following elements: the light-guiding layer 11, the reorienting layer 23, and the one or more liquids within the fluid tracking layer 16. Some amount of light absorption occurs naturally in each of these elements depending upon the materials used for their construction, and this natural absorption may provide sufficient heating to produce the desired thermocapillary effect, depending upon other elements of the system's optical and thermal design. Alternatively, absorption can be increased by adding absorbing materials to any of these elements. For example, absorbing dyes or pigments may be added to one or more of the liquids in the fluid tracking layer 16, to the light-guiding layer 11, or to the reorienting layer 23. If desired, dedicated absorbing layers can be included in the structure and located near the focal plane.

The absorbing materials can be chosen to have an absorption spectrum that preferentially absorbs incident light at desired wavelengths. For example, if the system is designed to collect sunlight for photovoltaic conversion, the properties of the photovoltaic cell will dictate which wavelengths of light can be efficiently converted into electricity and which (typically in the infrared and ultraviolet) cannot. Preferentially absorbing those wavelengths that cannot be efficiently converted into electricity will ensure that more of the useful light reaches the photovoltaic cell. Further, absorption of light within the light-guiding structure that cannot be efficiently converted into electricity by the photovoltaic device may improve the performance of the photovoltaic cell by reducing unnecessary heating of the photovoltaic device. Therefore, while in general it is preferable not to introduce absorption in the light-guiding layer 11 or cladding materials (cladding layer 21, and possibly chamber sidewalls 25) as this will create propagation loss for the guided light, if the absorption spectrum is well-tailored then it may be desirable to do so in order to control the output light spectrum.

An illustrative design of the coupling device of FIGS. 2a, 2b, and 2c uses a fluorocarbon oil with refractive index of approximately 1.3 as the low-refractive-index cladding material of cladding fluid layer 21 and a silicone oil with a refractive index of approximately 1.5 as the high-refractive-index fluid of the coupling fluid layer 22. The surface of the light-guiding layer 11 which is adjacent to the fluid tracking layer 16 is treated with a fluorinated coating to produce a low energy surface that is preferentially wet by the fluorocarbon oil. The fluorocarbon oil forms a layer preferably between approximately one-tenth micron and ten microns thick, and the silicone oil forms a layer which can be thicker than the fluorocarbon oil, such as between one and fifty microns thick. The interface between the two fluids 21 and 22 is stabilized by chamber sidewalls 25 that are preferentially wet by the fluorocarbon oil and that pin the fluid interface at the chamber edges. The chamber dimensions are near or preferably below the capillary distance for the fluids, which is approximately one millimeter, so that interface tension forces dominate over gravitational forces. A sawtooth reflective reorienting surface 23, such as illustrated in FIG. 3, is employed.

Figure 4:
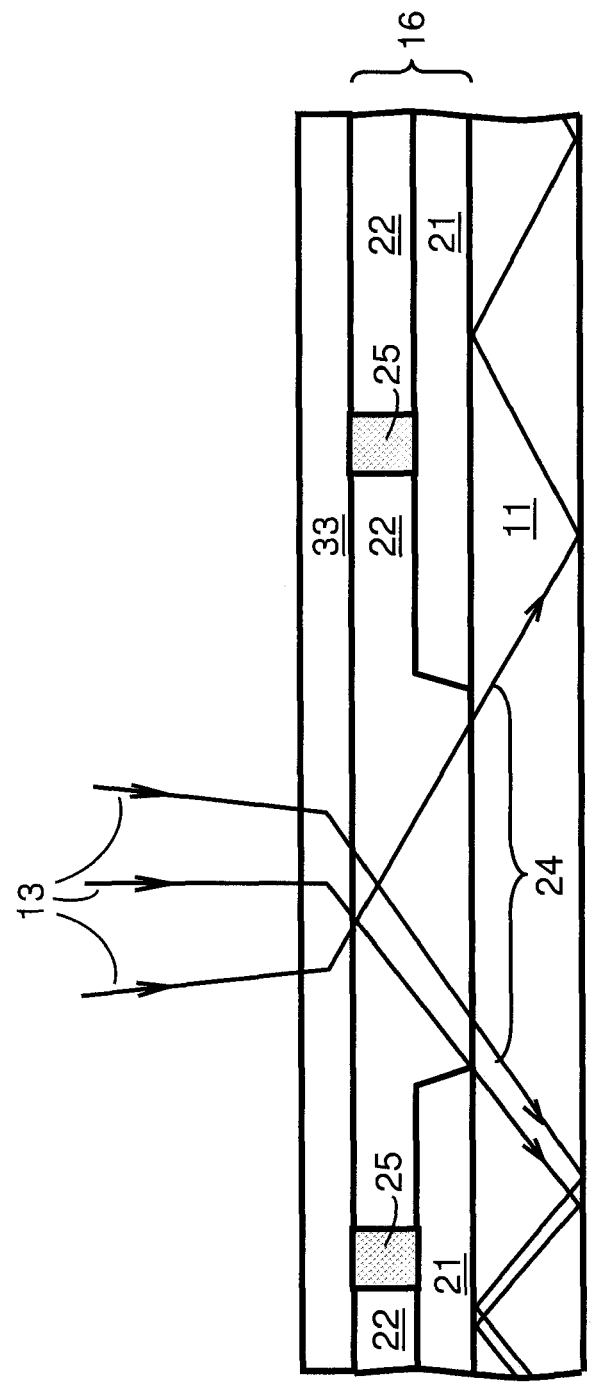
FIG. 4 provides a cross-sectional view of a coupling device with a retracting cladding fluid layer design and a transmissive reorienting surface, shown in the presence of focused light.

A variation of the design of FIGS. 2a-2c, shown in FIG. 4, employs a transmissive, rather than a reflective reorienting layer 33. In this variation, the transmissive reorienting layer 33 and fluid tracking layer 16 are placed between the focusing elements (not shown) and the light-guiding layer 11. The incident light rays 13 transit through the transmissive reorienting layer 33 and emerge on the other side at substantially different angles designed to improve coupling into the guided modes of the light-guiding layer 11. The transmissive reorienting layer 33 may operate through a variety of optical effects, including refraction, reflection, and diffraction.

A number of designs for the transmissive reorienting layer 33 are possible, depending upon the intended application.

One such design is an isotropic diffuser that spreads incident light evenly over a wide range of output angles. Not all of these light rays will be coupled into the light-guiding layer 11, but a diffuser has the advantage of being largely insensitive to changes in the angle of the incident light. An isotropic diffuser may therefore be a good choice as a transmissive reorienting layer 33 when a wide tolerance to the angle and placement of the focused light spot is desired and when a lower coupling efficiency can be accepted.

Figure 5:
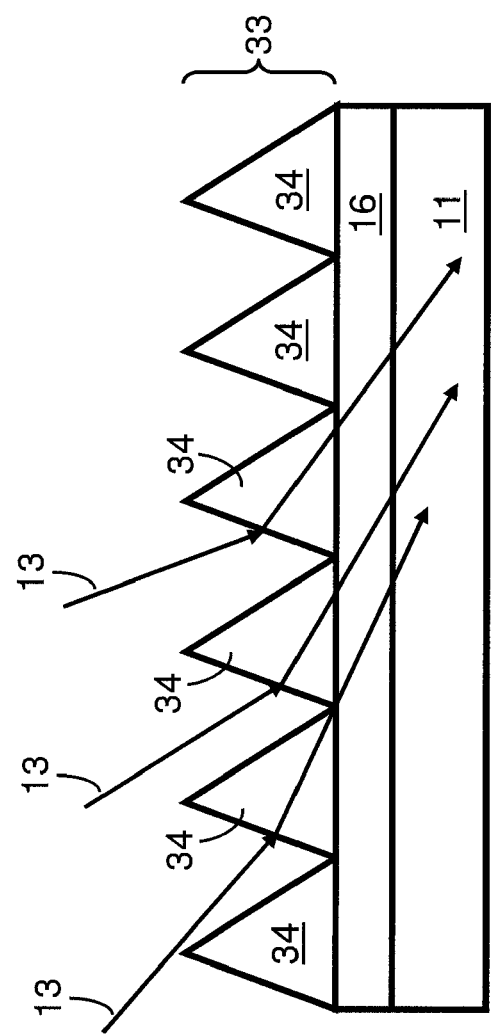
FIG. 5 provides a cross-sectional view of a prism array reorienting layer.

If the light source characteristics are further constrained, more efficient transmissive reorienting layers 33 can be utilized. For example, if the average angular orientation of the incident light 13 is fixed, an array of prisms 34 can be employed as a transmissive reorienting layer 33. These prisms 34 can be designed to bend the incident light rays 13 so that they couple into the light-guiding layer 11, as shown in FIG. 5. Such a prism array can be tailored to the incident light characteristics in order to provide optimized light-guide coupling. A uniform prism array can efficiently couple light at a predetermined range of angles where the location of the focus spot is allowed to vary across the chamber.

Another type of application may produce an incident light cone whose angular orientation or solid angle varies in a predictable fashion as the focus spot moves across the chamber. An example is the use of static lenses to concentrate sunlight and focus it into a spot on the transmissive reorienting layer 33: as the angle of the sun changes, the spot of focused light will move across the transmissive reorienting layer 33, and in each location will strike the reorienting layer at a different range of incident angular orientations. In this situation, the transmissive reorienting layer 33 can be tailored in each location for the corresponding incident angles of light. For example, if a prism structure is employed, its design can be varied across the chamber to account for variation in the orientation or solid angle of the light cone produced by the external focusing optics as the focus spot moves over the reorienting layer. In other words, the shape, size, and/or geometry of the prisms 34 of the prism array can vary throughout the transmissive reorienting layer 33.

Figure 6:
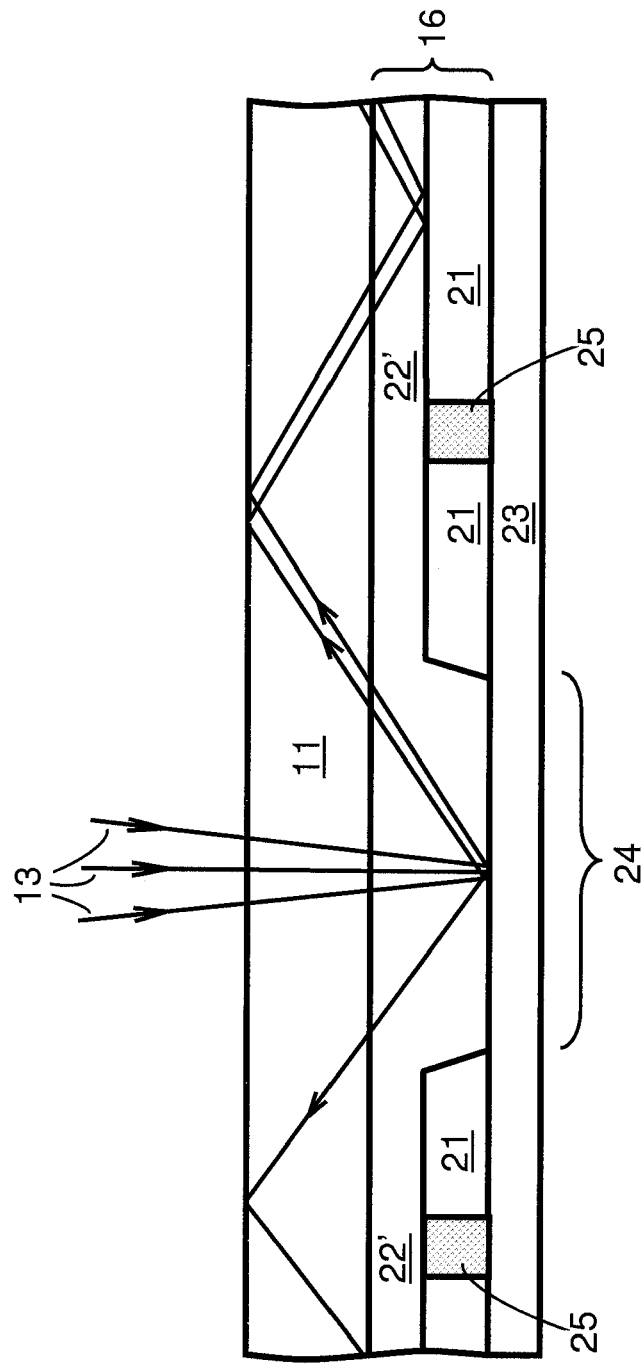
FIG. 6 provides a cross-sectional view of a coupling device with a coupling layer that can function as a fluid light-guide layer, along with a retracting cladding fluid layer, shown in the presence of focused light.

Another variation of the design of FIGS. 2a-2c, shown in FIG. 6, reverses the position of the fluids in the fluid tracking layer 16, such that at least a portion of the coupling fluid layer 22' is between the cladding fluid layer 21 and the light guiding layer. In this orientation, the coupling fluid layer 22' in combination with the light-guiding layer 11 serve to guide light through the light-guiding structure, the guided light being transported through the bulk portion of the light-guiding layer 11 and through a bulk portion of the coupling fluid layer 22'. The high-refractive-index coupling fluid then forms the light-guide core, or a portion of the light-guide if the top material 11 has a similarly high refractive index (as shown in FIG. 6). The guided light travels within the high refractive index fluid 22', and the cladding fluid of cladding fluid layer 21 is in contact with the reorienting layer 23. This geometry may be employed with either a reflective reorienting layer 23 (as shown in FIG. 6) or a transmissive reorienting layer 33 (not shown).

Figure 7:
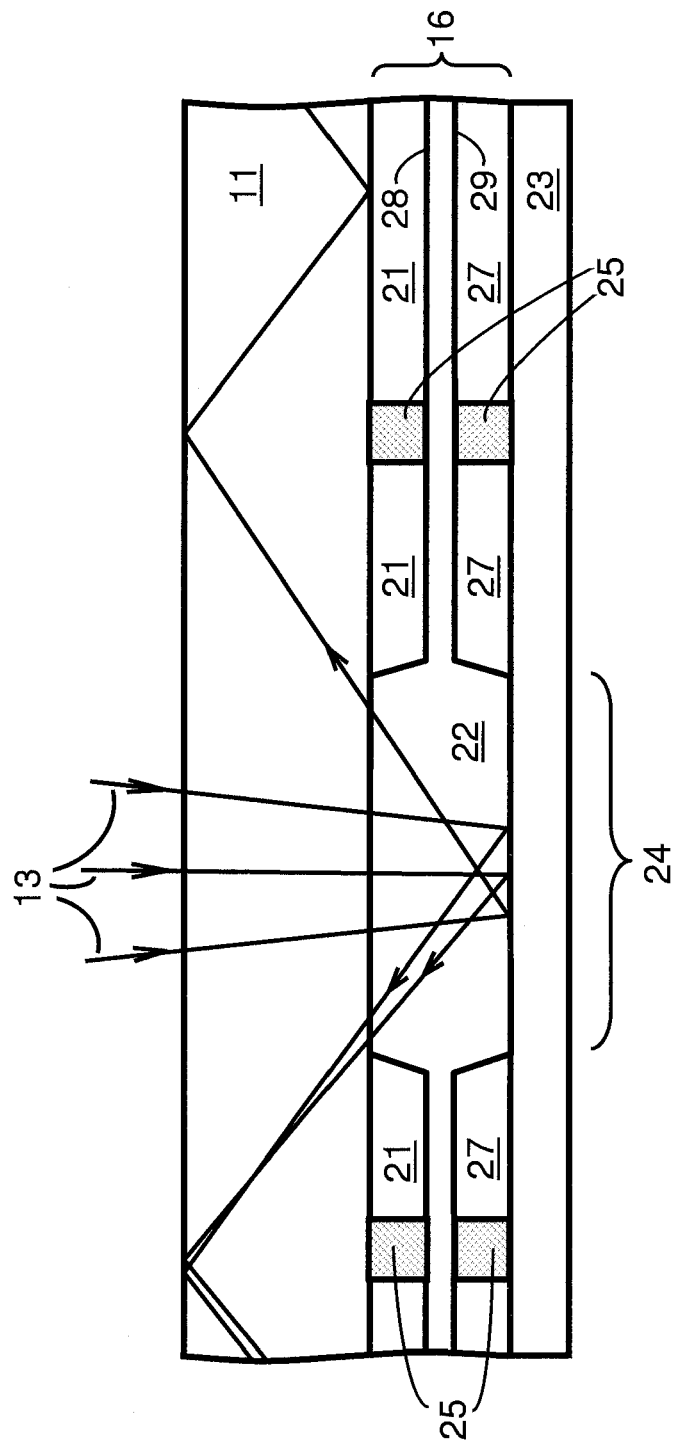
FIG. 7 provides a cross-sectional view of a coupling device with three fluid layers, shown in the presence of focused light.

Yet another variation, shown in FIG. 7, uses a tracking layer 16 which includes three fluid layers 21, 22, and 27. The low-refractive-index cladding fluid layer 21 is adjacent to the light-guiding layer 11. A high-refractive-index coupling fluid 22 fills the middle of the tracking layer. A layer of fluid containing a high concentration of absorbing materials, i.e., an absorbing fluid layer 27, is placed adjacent to and/or contacting the reorienting layer 23. Both fluid interfaces 28 and 29 may be stabilized by controlling surface properties and optionally by utilizing chamber sidewalls 25 that extend from both walls of the tracking layer. The middle coupling fluid 22 is immiscible or partially miscible with both the cladding fluid and the absorbing fluid. When focused light falls upon the fluid tracking layer 16, it produces high local heating in the absorbing fluid. This causes both the absorbing fluid and the cladding fluid to thin or rupture, producing a transparent high-refractive-index optical path between the reorienting layer 23 and the light-guiding layer 11. As long as the focused light is present in the same location, the return of these fluids is inhibited by heat that is generated if the absorbing fluid re-enters the focal area.

Coupling Device Designs with Sliding Droplets

Figure 8:
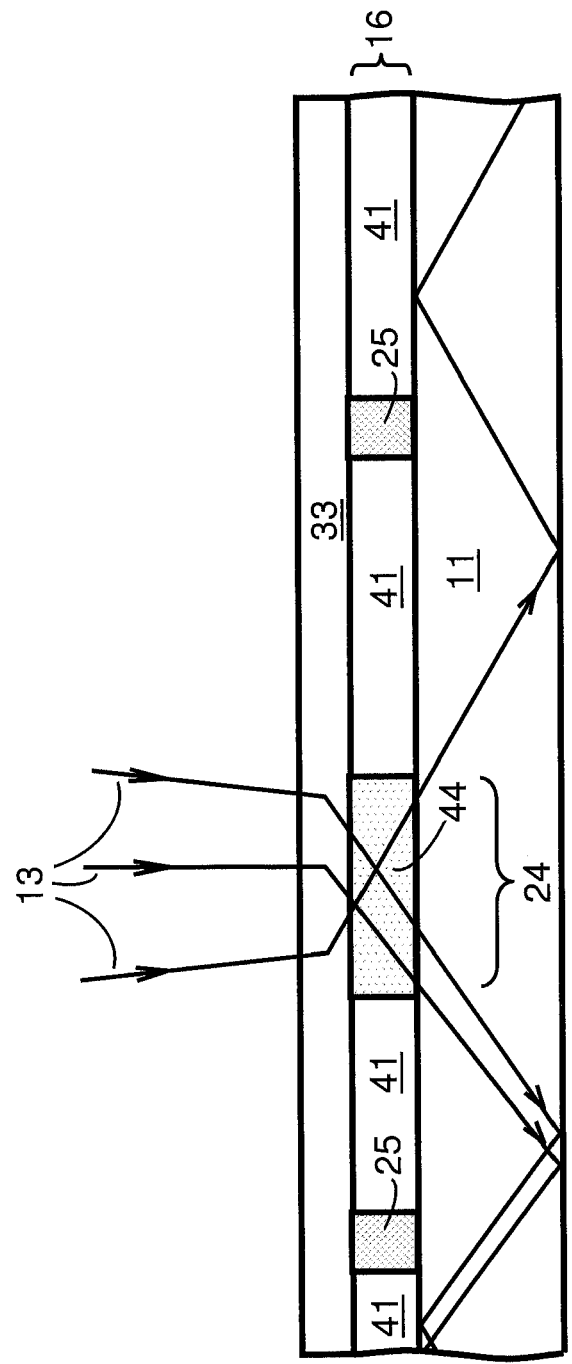
FIG. 8 provides a cross-sectional view of a coupling device with a high-index coupling droplet and a transmissive reorienting layer.

As illustrated in FIGS. 8-12, an apparatus for coupling light into a light-guiding structure can make use of thermocapillary effects not primarily to thin a fluid film but to cause lateral fluid motion. In this design, the tracking layer is divided by chamber sidewalls 25 into an array of microfluidic chambers, so that a single microfluidic chamber is associated with each focusing element. FIG. 8 shows only a single chamber. The chamber contains a small droplet of fluid ("coupling droplet" 44) with high refractive index, preferably about the same as or greater than that of the light-guiding layer 11, thereby providing a high refractive index light path linking the reorienting layer 33 to the light-guiding layer 11 at the coupling location 24. The volume of the coupling droplet 44 is chosen so that its area is approximately matched to the size of the focused light spot, and the chamber height (i.e., the thickness of cladding fluid layer 41) is sufficiently small to flatten the surface of the droplet and prevent it from taking on a spherical-cap shape, but sufficiently large to provide adequate light-guide cladding. The thickness of cladding fluid layer 41 can be between about 0.1 microns and 500 microns, such as between 0.1 microns and 10 microns or between 10 microns and 100 microns. The remainder of the chamber volume contains cladding fluid of a cladding fluid layer 41, which can for example be a second immiscible or partially miscible fluid of lower refractive index, or simply air or vapor, the cladding fluid layer 41 acting as cladding for the light-guiding layer 11.

The chamber can employ sidewalls 25 to ensure that the droplet remains confined within the area across which the focal point may vary. The sidewalls 25 may traverse the entire fluid tracking layer 16 and contact the light-guiding layer 11, in which case they may be made of a material with a low refractive index in order to provide a cladding function where they contact the light-guiding layer 11. Alternatively, a reflective minor surface (not shown) may be placed at the junction of the light-guiding layer and the chamber sidewalls 25 in order to ensure that guided light does not exit the light-guiding layer 11 and enter the chamber sidewalls 25. In a close-packed array of chambers within a fluid tracking layer 16, the sidewalls 25 may be made to protrude only part of the way into the tracking layer (not shown), providing a sufficient barrier to prevent the droplet from crossing into a neighboring chamber while still permitting cladding fluid, if present, to flow between the chambers.

Droplet motion can be produced via the thermocapillary effect. Partial absorption of the incident focused light 13 produces a local temperature rise at the location of the focused light, i.e., coupling location 24, and a temperature gradient surrounding that location. The temperature gradient causes unequal surface tension on the sides of the droplet 44 (or interface tension if a cladding fluid is utilized), which causes the droplet 44 to move toward the focal point. The direction and speed of droplet motion in response to the temperature gradient will depend on the change in the surface tension of the liquid (or the interfacial tension between the two liquids) as a function of temperature, and also on the contact angle formed by the droplet with the chamber walls. These can be varied through the choice of chamber wall material, the application of surface coatings to the chamber walls, the choice of liquids, and the introduction of surfactants in one or both liquids. Examples of immiscible or partially miscible liquids that could be used are aqueous solutions, water-soluble fluids, hydrocarbon oils, silicone oils, organic compounds, and fluorocarbon oils. Surface coatings could include fluorinated low-surface-energy coatings. A wide variety of surfactants can be added to the fluids, which can dramatically affect the dependence of the interface tension on temperature. The materials used to construct and house the system can be engineered to provide thermal properties that optimize the temperature gradient profile for fluid movement.

The reorienting layer 33 shown in FIG. 8 is of transmissive design. The incident light rays transit through the transmissive reorienting layer 33 and emerge on the other side at different angles designed to improve coupling into the guided modes of the light-guiding layer 11. Once properly coupled light rays enter the light-guiding layer 11, they undergo total internal reflection at the light-guiding layer/cladding layer interface and remain trapped in the light-guiding layer 11. The reorienting layer 33 may operate through a variety of optical effects, including refraction, reflection, and diffraction, as previously described.

Figure 9:
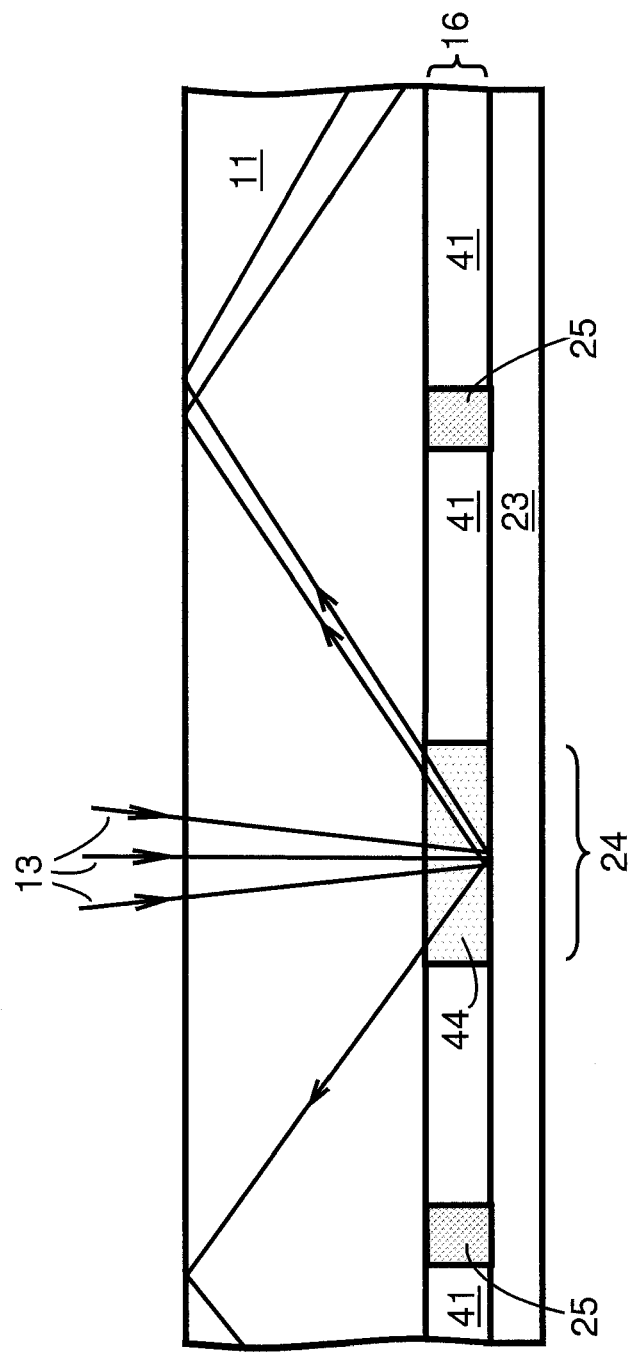
FIG. 9 provides a cross-sectional view of a coupling device with a high-index coupling droplet and a reflective reorienting layer.

Another implementation, shown in FIG. 9, uses a reflective reorienting layer 23 instead of a transmissive one. In this design, both the fluid tracking layer 16 and the reorienting layer 23 are located on the opposite side of the light-guiding layer 11 from the source of the focused light 13. The reorienting layer 23 is located at or near the focal plane of the external optics, and focused light passes through the light-guiding layer 11 before striking the reorienting layer 23. The reflective reorienting layer 23 can be a diffuse or scattering reflector, a tailored angular reflector, or other reflecting surface, as previously described.

Figure 10:
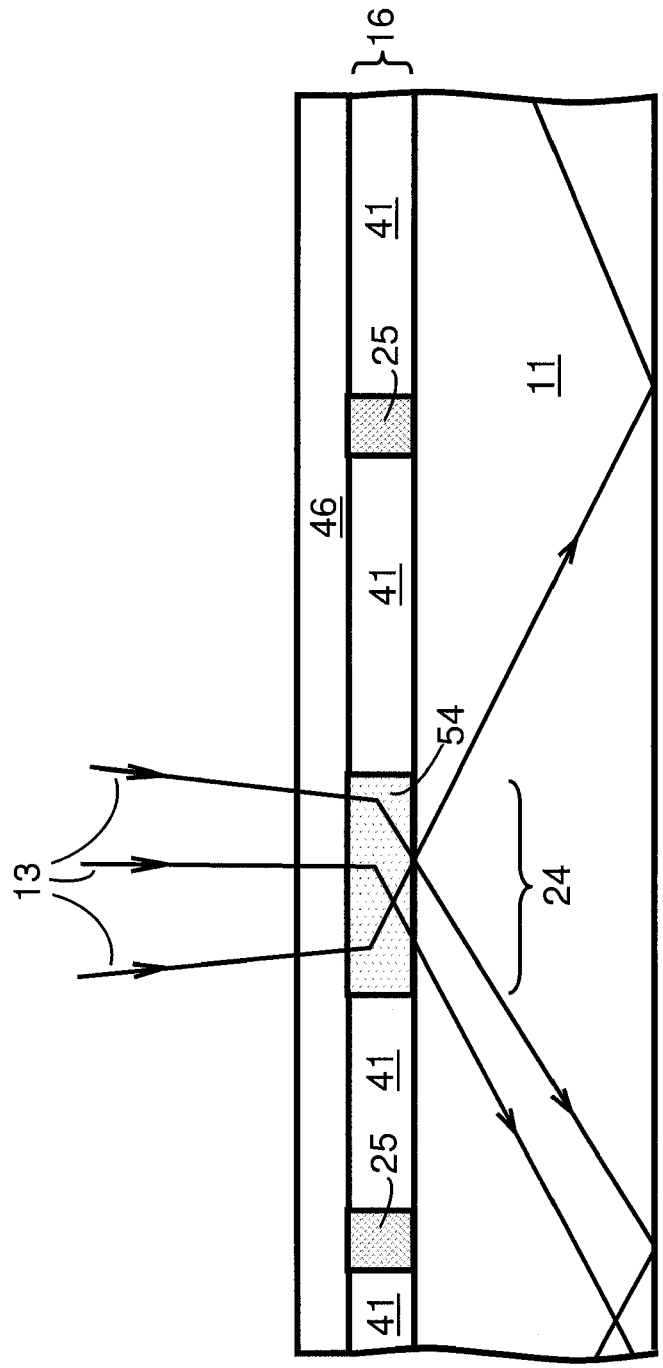
FIG. 10 provides a cross-sectional view of a coupling device with a high-index transmissive reorienting droplet.

In another implementation, shown in FIG. 10, the reorienting layer is eliminated, and reorientation of the focused light occurs instead within the coupling droplet 54 itself. Hence, coupling droplet 54 serves to redirect the incident light rays 13 as well as to allow them to be coupled into the light-guiding layer 11. A layer of transparent material 46 is used to contain the tracking fluid where the reorienting layer had been placed in the previous implementations. To make the coupling droplet 54 serve as a reorienting element, optically active materials can be suspended within the liquid of the droplet. These can be, for example, particles that scatter incoming light, reflective materials such as metal flakes, or refractive materials that diffuse light. The optically active materials are designed so that they disperse within the coupling droplet liquid but not within the cladding fluid. For example, oil-dispersible white pigment particles may be used as a scattering medium and dispersed in a coupling droplet 54 made of oil, while an immiscible aqueous solution is used to provide the low-refractive-index cladding fluid of cladding fluid layer 41.

Figure 11:
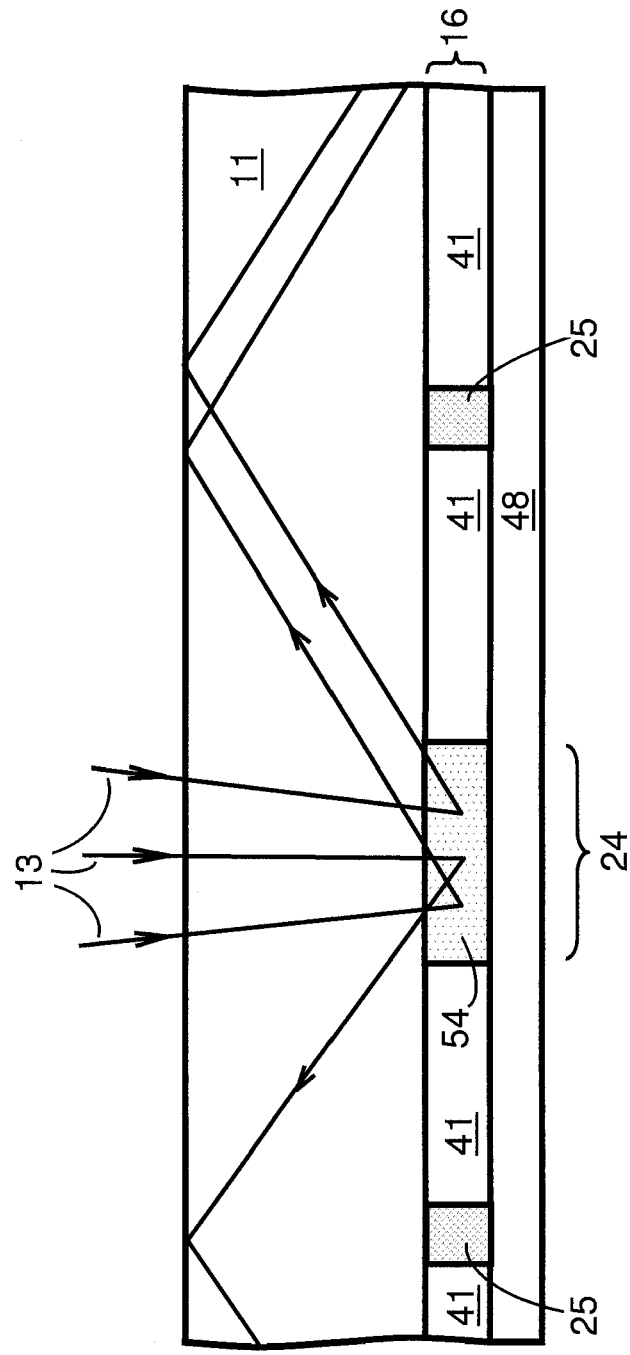
FIG. 11 provides a cross-sectional view of a coupling device with a high-index reflective reorienting droplet and a highly-absorbing layer.

The tracking layer 16 can be located between the focused light source and the light-guiding layer 11 if the coupling/reorienting droplet 54 provides a refractive or transmissive scattering effect (as shown in FIG. 10), or opposite the light source if the reorienting droplet provides a reflective or reflective scattering effect. In the latter case, the use of a coupling/reorienting droplet 54 rather than a reorienting layer provides the freedom to use a highly-absorbing layer as a heat-generating mechanism. As shown in FIG. 11, absorbing layer 48 is placed on the opposite side of the tracking layer 16 from the light-guiding layer 11 and may optionally serve as a wall for containing the tracking layer fluids. When the coupling/reorienting droplet 54 is properly located at the focus of the light, it obscures the absorbing layer 48 and very little heat is generated. When the droplet 54 is not properly located, however, the focused light 13 strikes the highly absorbing layer 48, resulting in high local heating that provides a strong driving force for droplet motion, thereby attracting the droplet 54 to the coupling location 24.

A further variation upon this design is to use the tracking fluid layer 16 as part, or all, of the light-guide. This is achieved by embedding the coupling/reorienting droplet 54 in an immiscible or partially miscible fluid that is of similar refractive index to that of the coupling/reorienting droplet 54. The walls containing the fluid layer may also be of similar refractive index, in which case they too form part of the light-guide, or they may be of substantially lower refractive index and form cladding for the liquid light-guide layer.

Figure 12:
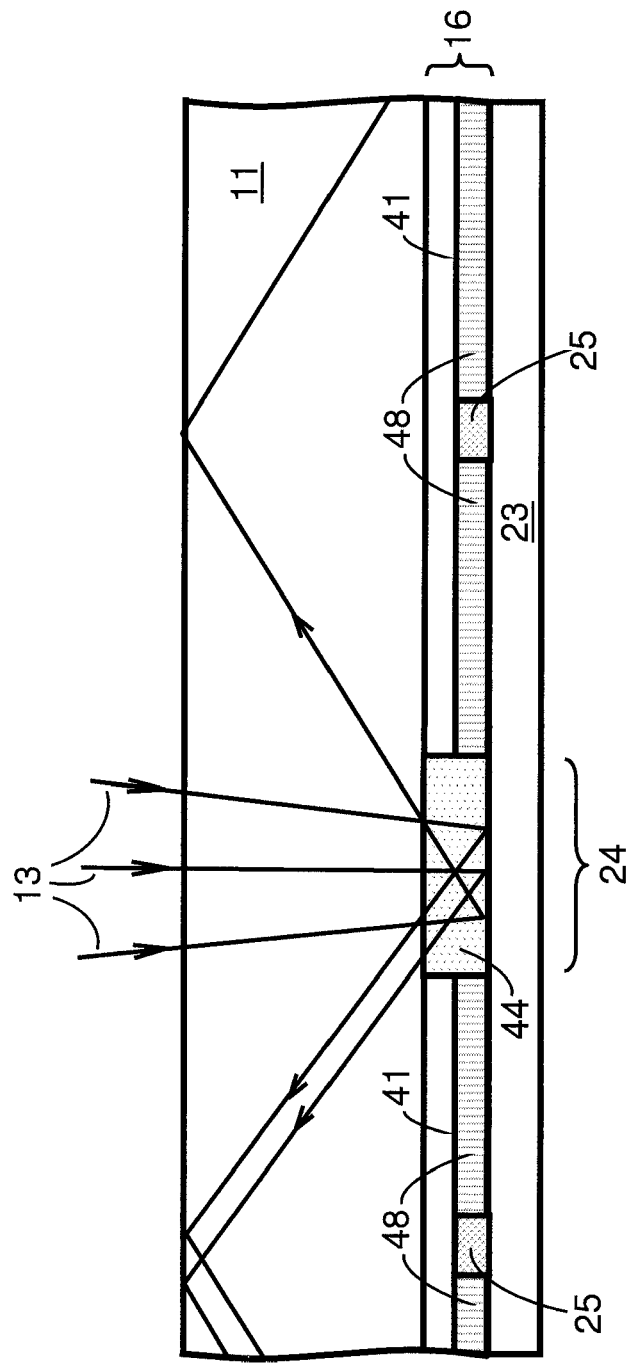
FIG. 12 provides a cross-sectional view of a coupling device with a high-index coupling droplet, cladding fluid, and a highly-absorbing fluid.

Another variation in design for reflective devices is to use a total of three immiscible or partially miscible fluids in the device: one high refractive index fluid 44 for the coupling droplet and two fluids 41 and 48 in a layered structure within the remaining area of the tracking layer, as shown in FIG. 12. The fluid layer 41 adjacent to the light-guiding layer 11 serves as light-guide cladding and provides a low refractive index and high transparency for low-loss light-guiding. The fluid 48 adjacent to the reorienting layer 23 can include a high concentration of absorbing materials. When the coupling droplet 44 is properly located at the focus of the light, the absorbing fluid 48 is outside the light path and therefore very little heat is generated. When the droplet 44 is not properly located, however, the focused light strikes the highly absorbing fluid of the absorbing layer 48, resulting in high local heating that provides a strong driving force for droplet motion, causing the droplet 44 to move to the location where the light beam 13 is incident.

The layered fluid structure 16 can be stabilized using a variety of techniques, including fluid separation due to density variation as well as manipulation of the fluid tensions through the properties of the fluids and the chamber walls 25, as described previously. If the chamber walls 25 are used to stabilize the fluid layers through fluid tension, then the spacing between chamber walls 25 must be near or below the capillary distance, such as less than about 1 cm apart. Since the chamber walls also serve to confine the movement of the coupling droplet 44, the capillary distance therefore sets an approximate upper limit on the distance that the coupling droplet 44 can be made to travel using this design.

Coupling Device Designs with Floating Reorienting Elements

Figure 13:
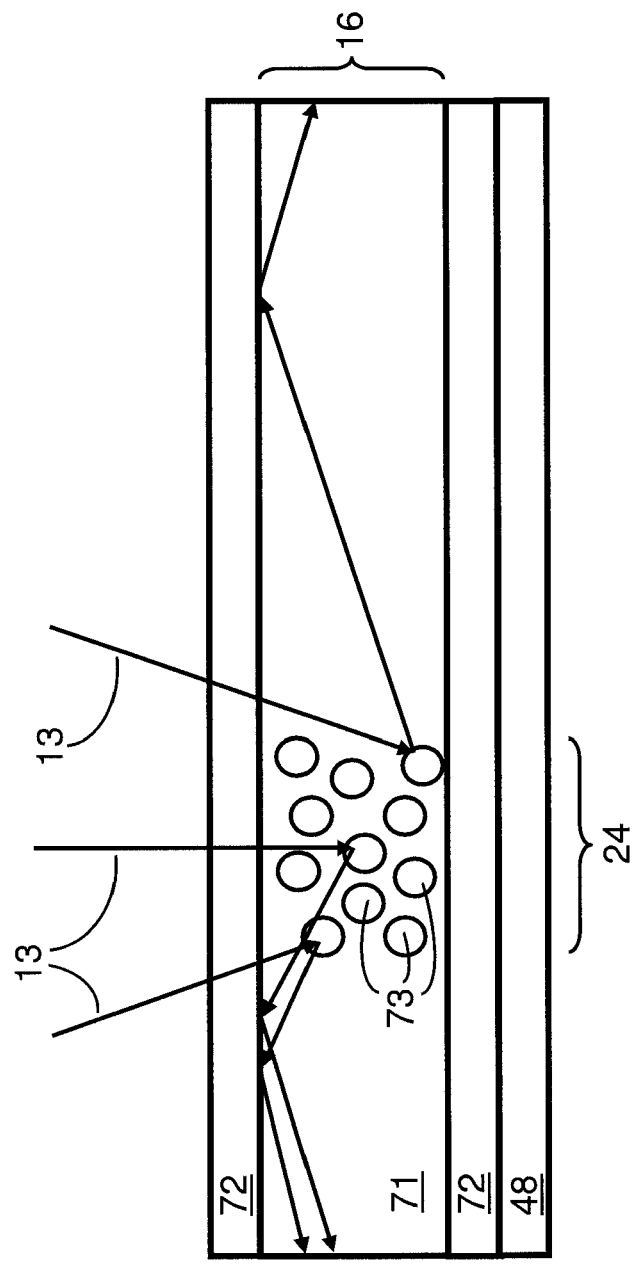
FIG. 13 provides a cross-sectional view of a coupling device with a fluid light-guide layer and reorienting droplets.

In the design of FIG. 13, liquid within the tracking chamber forms part or all of the light-guide core. Reorienting layers are not used, and instead light reorientation occurs at the site of moveable elements within the tracking layer 16. In the device shown in FIG. 13, the tracking layer 16 contains a light-guiding layer 71 formed of a high-refractive index fluid that provides light-guiding and also contains small reorienting droplets 73 or vapor bubbles within the fluid. These droplets 73 or bubbles are sufficiently small that they are substantially spherical in shape and are not flattened against the tracking layer walls (i.e., the interface between the fluid tracking layer 16 and cladding wall layers 72), and that many droplets 73 or bubbles packed together can occupy the coupling location 24, which again can be about the same size as the focal spot of the incoming light beam 13. The reorienting droplets 73 or bubbles may be stabilized with the use of surfactants in the light-guiding fluid layer 71. If vapor bubbles are used, they may be permanent features or may be generated locally at the hot spot through the choice of a light-guiding fluid with an appropriate boiling point. In some implementations, no bubbles or droplets 73 are present in the absence of incoming focused light or other local heating mechanisms, but in the presence of a focused incoming beam, the incoming light 13 heats the light-guiding fluid to a temperature sufficient to generate reorienting bubbles. A sufficient temperature can be at, near, slightly below, or above the boiling point of the light-guiding fluid. If droplets are used, they may be made of a transparent low-refractive index fluid. The substantially spherical surfaces of the low-refractive-index droplets 73 or bubbles located at the hot spot serve to scatter the focused light, reflecting and refracting it so that the light is reoriented and can be guided by the light-guiding layer 71 as shown.

Alternatively, optically active materials such as reflecting or refracting particles may be suspended in the droplets 73 to provide the reorienting function, in which case the refractive index of the droplets may be varied, as refraction and reflection at the interface of the droplets 73 and the fluid of the light-guiding layer 71 is not required to provide the reorienting function. Also, if optically active materials are added the dimensions of the reorienting droplets 73 are no longer constrained. If desired, larger and fewer droplets may be used, such that they flatten against the chamber walls.

Thermocapillary forces will naturally attract vapor bubbles toward a hot spot, and, with appropriately chosen fluids and chamber geometry, suspended droplets 73 can also be attracted to the hot spot. In this design, the bulk fluid of the tracking layer 16 also serves as the light-guide. The walls 72 containing the fluid may be of lower refractive index and therefore serve as light-guide cladding (as shown in FIG. 13), or of higher refractive index and therefore serve as part of the light-guide, with guided light traveling both through the bulk of the wall material 72 and through the fluid of the light-guiding layer 71. A highly absorbing layer 48 may optionally be employed, as also shown in FIG. 13.

Figure 14:
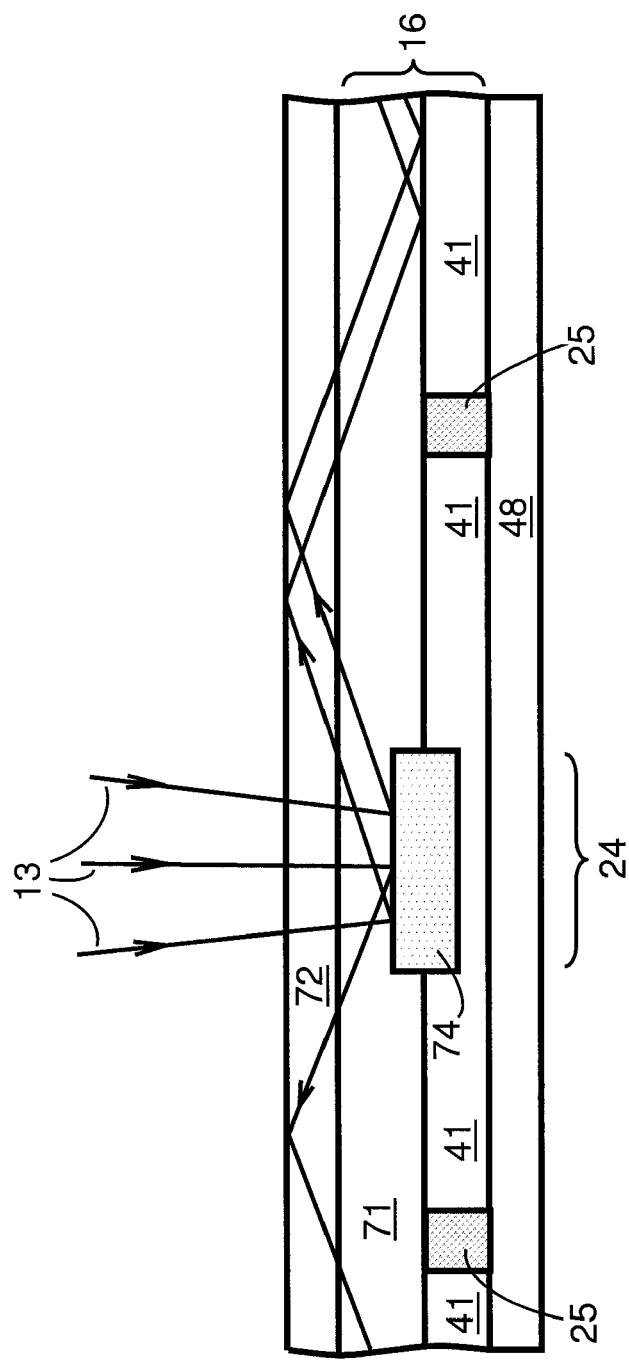
FIG. 14 provides a cross-sectional view of a coupling device with a reorienting element suspended at the interface of two fluid layers.

In a variation on this design, the fluid tracking layer 16 contains two layers of immiscible or partially miscible fluids 71 and 41, as shown in FIG. 14. The two-layer fluid structure may be formed and stabilized using a variety of techniques, including fluid separation due to density variation, as well as manipulation of the surface properties of the light-guide, reorienting layer, and chamber sidewalls. In the example shown in FIG. 14, chamber walls 72, with a surface that is preferentially wet by the upper fluid 71 (i.e., the fluid of the light-guiding layer 71), are used to stabilize the layer structure. The chamber walls 72 shown in FIG. 14 serve as part of the light-guide, although as in FIG. 13, they could be formed of a lower index material and function as light-guide cladding.

Suspended at the interface between the fluid layers 71 and 41 are one or more reorienting elements 74. The reorienting elements 74 may be reflective or refractive particles that collect at the interface or a small piece of an optically-active film, as depicted in FIG. 14. For example, a thin plastic film containing angled reflector features which has been treated to be hydrophilic on one surface and hydrophobic on the other surface can be suspended at the interface between an aqueous solution and an oil.

When a hot spot is created at a coupling location 24 in the tracking layer 16 by partial absorption of the focused light 13, the interface tension between the two liquids is affected. The local variation in interface tension creates fluid flows at the interface. With properly chosen fluids and chamber dimensions, convective fluid flow toward the hot spot will occur and the optically-active reorienting elements 74 suspended at the interface will collect automatically at the hot spot.

The two fluids 71 and 41 may be chosen with substantially different refractive indices so that one (layer 71) serves as either part or all of the light-guide core, while the other (layer 41) serves as a cladding layer. Or they may be chosen with more closely matched refractive indices so that both serve as light-guide core while cladding is provided either by the walls 72 of the tracking layer or the outside medium.

If the reorienting elements 74 provide a reflective or reflective-scattering effect, the design provides the freedom to use a highly-absorbing layer 48 as a heat-generating mechanism, as shown. This layer is placed outside the cladding, whether the cladding is provided by a fluid layer, the solid wall of the tracking layer, or an exterior layer of low refractive index. In the example shown in FIG. 14, the lower fluid layer 41 provides the cladding function and the highly-absorbing layer 48 is used as a tracking layer wall. Also in the example shown in FIG. 14, both the upper fluid layer 71 and the upper containing wall 72 have a high refractive index and act as light-guiding material. When the reorienting element or elements 74 are properly located at the focus of the light, they obscure the absorbing layer 48, and very little heat is generated. When the reorienting element or elements 74 are not properly located, however, the focused light 13 strikes the highly absorbing layer 48, resulting in high local heating that provides a strong driving force for fluid flow at the liquid interface, resulting in the reorienting element 74 being drawn to the coupling location 24.

Coupling Device Optical Design Variations

Figure 15:
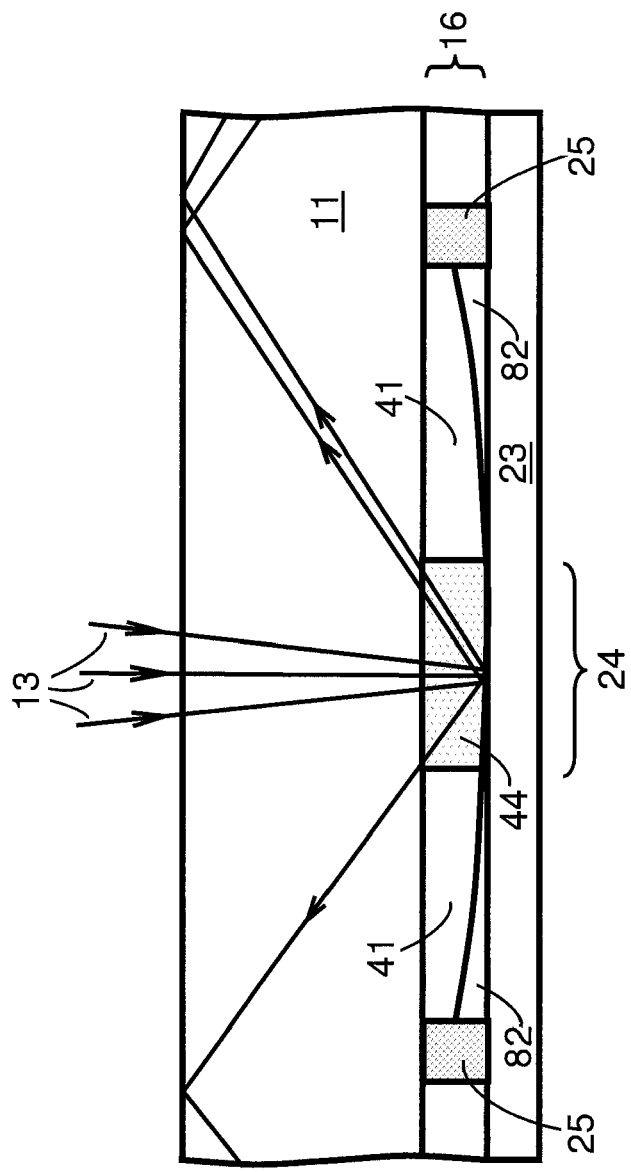
FIG. 15 provides a cross-sectional view of a coupling device with variable chamber height.

The focused light spot size may vary depending upon its location across the chamber. For example, if a fixed lens is used to focus sunlight onto the chamber, the spot size can change as the angle of incident light varies due to focusing aberrations. One solution to this problem is to use a larger volume coupling or reorienting droplet in order to improve light capture when the focus spot is large, but this will incur unnecessary additional light-guide losses when the focus spot is small. Instead, it is desirable to vary the size of the coupling site automatically as it moves across the chamber. This can be accomplished by varying the height of the chamber across its area, as shown in FIG. 15. The area of the coupling location 24, i.e., the area of coupling droplet 44, will increase where the chamber is narrow (i.e., where cladding fluid layer 41 is thinner) and decrease where the chamber is wider (i.e., where cladding fluid layer 41 is thicker). The example shown in FIG. 15 produces a smaller coupling area in the center of the chamber and a larger coupling area toward the edges. The example shown in FIG. 15 uses the coupling device design of FIG. 9, where an additional high-index fill material layer 82 is included between portions of the cladding fluid layer 41 and the reorienting layer 23 to create regions of varying thickness of cladding fluid layer 41. This technique can also be applied to the other designs described herein. The design shown in FIG. 15 maintains a flat reorienting layer 23 and provides a varied chamber height by adding additional transparent material 82 with a high refractive index (approximately matched to that of the light-guiding layer 11 and the coupling droplet 44). Alternatively, the reorienting layer 23 can be curved as well, following the shape of the chamber and eliminating the need for additional material layer 82.

Figure 16:
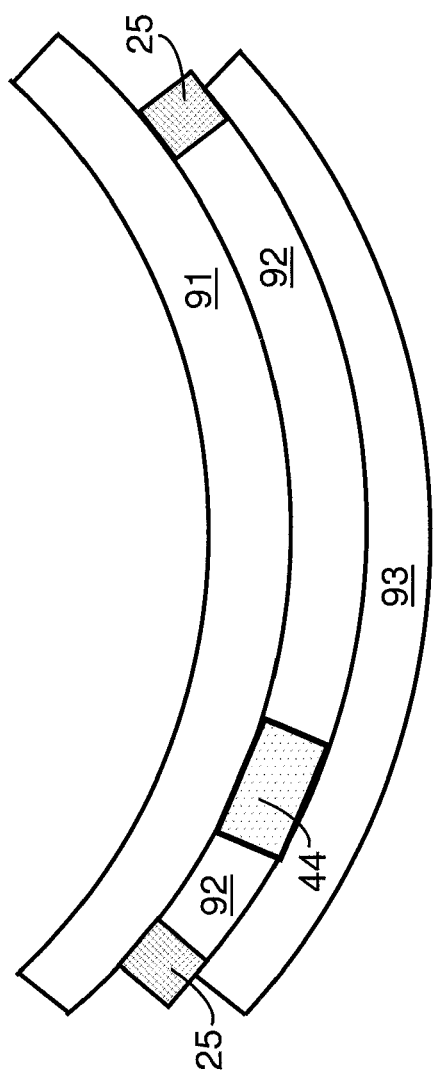
FIG. 16 provides a cross-sectional view of a coupling device with a curved chamber and light-guide.

In some applications, the external focusing optics may not produce focused spots that occupy a flat focal plane. In order to compensate for this, the flat light-guiding layers and flat tracking layers described so far can be replaced by a curved light-guiding layer and curved tracking layer, as shown in FIG. 16. FIG. 16 shows the curved light-guiding layer 91 and curved tracking layer, which includes curved cladding fluid layer 92 and coupling droplet 44, implemented with the design of FIG. 9, but it can also be applied with the other designs described herein. Layer 93 is a curved reorienting layer. If the light-guiding structure is curved, its dimensions can be chosen to minimize light-guide loss that results from the curvature.

Integration of Coupling Devices with Focusing Optics

The tracking coupler device designs described above can be integrated as a single device or as an array of devices, and can be independently matched with a single focusing element or focused light source, or with an array of focused light sources. When using an array of focusing elements to capture direct beam optical energy, the focusing elements can be refractive, reflective, or diffractive, or can consist of combinations of different elements. If using coupling device designs based on lateral thermocapillary motion, such as those of FIGS. 8 through 15, a single chamber may optionally be matched with each focusing element in an array; however, if using coupling device designs based on thermocapillary film thinning, such as those of FIG. 2, 4, 6, or 7, the chambers need not match one-to-one with the focusing elements. Two exemplary designs for arrays are presented below, but many combinations are possible.

Figure 17:
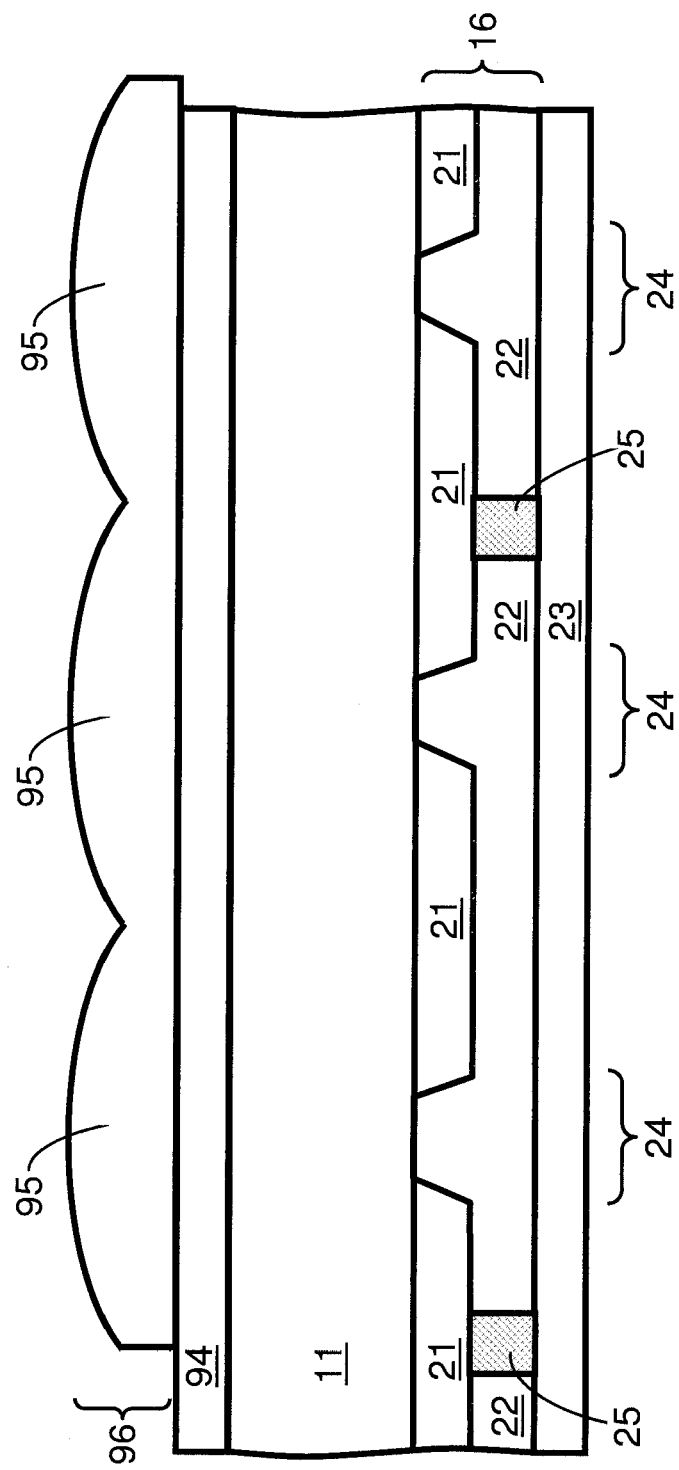
FIG. 17 provides a cross-sectional view of an example application of the coupling device of FIG. 2 in a system with an array of focusing lenses.

FIG. 17 depicts an example application of the light-tracking coupling device of FIG. 2 combined with an array 96 of lenses 95 formed in a sheet. The lenses 95 within the array 96 provide focused light (light rays are omitted from the figure for the sake of clarity). A cladding layer 94 of low refractive index is between the lens array sheet 96 and the light-guiding layer 11. The cladding layer 94 may be made of a fluoropolymer material with refractive index of approximately 1.3, or of another material of low refractive index. Alternatively, the cladding may be provided by vacuum, air, or a vapor or liquid of appropriately low refractive index.

While this figure and subsequent figures depict only a single lens surface used for light focusing, the system may also be designed with focusing systems comprised of multiple lenses and/or other optical elements. Furthermore, while the example of FIG. 17 uses the coupling device of FIG. 2, any of the tracking coupling device designs disclosed herein could be utilized.

Figure 18:
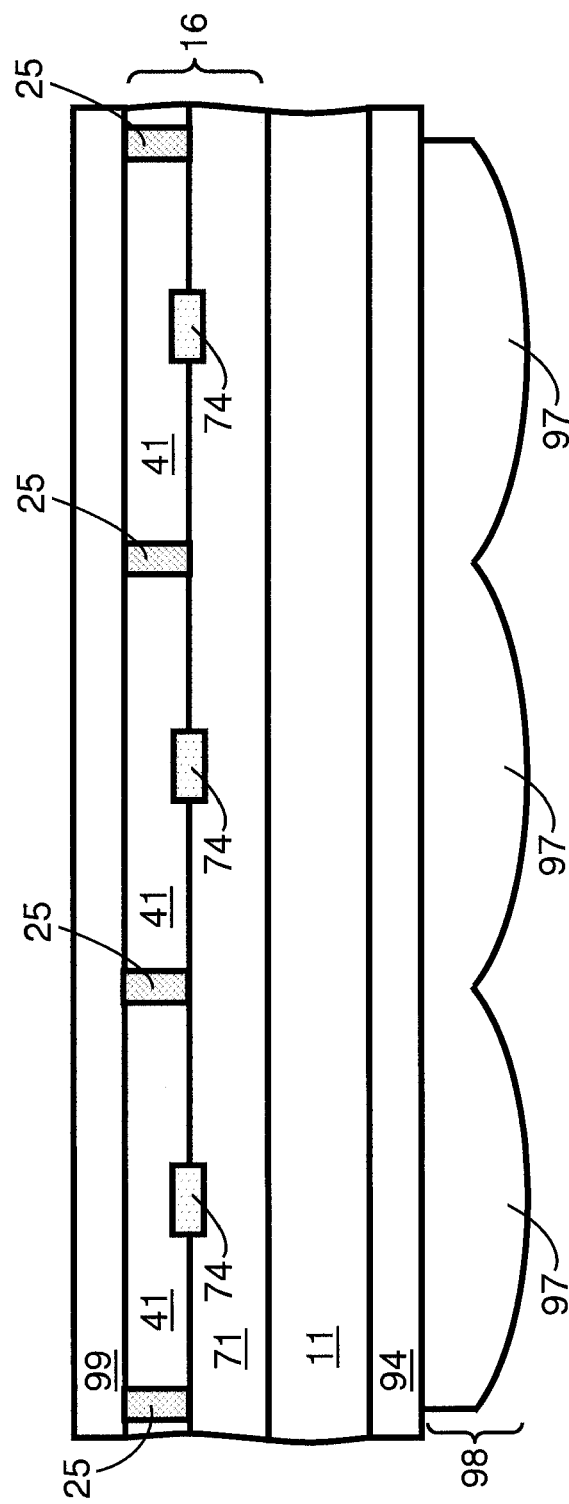
FIG. 18 provides a cross-sectional view of an example application of the coupling device of FIG. 14 in a system with an array of focusing mirrors.

FIG. 18 shows an example using an array 98 of curved reflective minors 97 as the focusing elements and utilizing coupling devices similar to those of FIG. 14. Because the use of reflective focusing surfaces can require the tracking-coupling device to be largely transparent, they are best paired with those coupling device designs that utilize mobile reorienting elements 74 rather than fixed reorienting layers. In this design, a single focusing element 97 is matched with each chamber. Within each chamber, a reflective reorienting element 74 is suspended at the interface between a light-guiding fluid 71 and a cladding fluid 41. The fluids are enclosed by the light-guiding layer 11 on one side and a transparent window layer 99 on the other side. Incoming light (not shown for the sake of clarity) enters the structure through the outer surface of the transparent window layer 99 and passes through the fluid layers 41 and 71, the light-guiding layer 11, and a cladding layer 94. The light is then reflected and focused by the focusing elements 97, after which it is coupled into the light-guiding structure. The thermal properties of the system may optionally be designed to limit thermal cross-talk between neighboring chambers, for example by separating the chambers with a thermal insulator. Depending upon the optical design of the lenses and the array, at some incident light angles the focused light from one minor may enter the chamber matched to a neighboring mirror. In order to capture light at this angle of incidence, the reorienting elements 74 are designed to capture, with some efficiency, light cones incident either from the associated minor or from neighboring minors.

Figure 19:
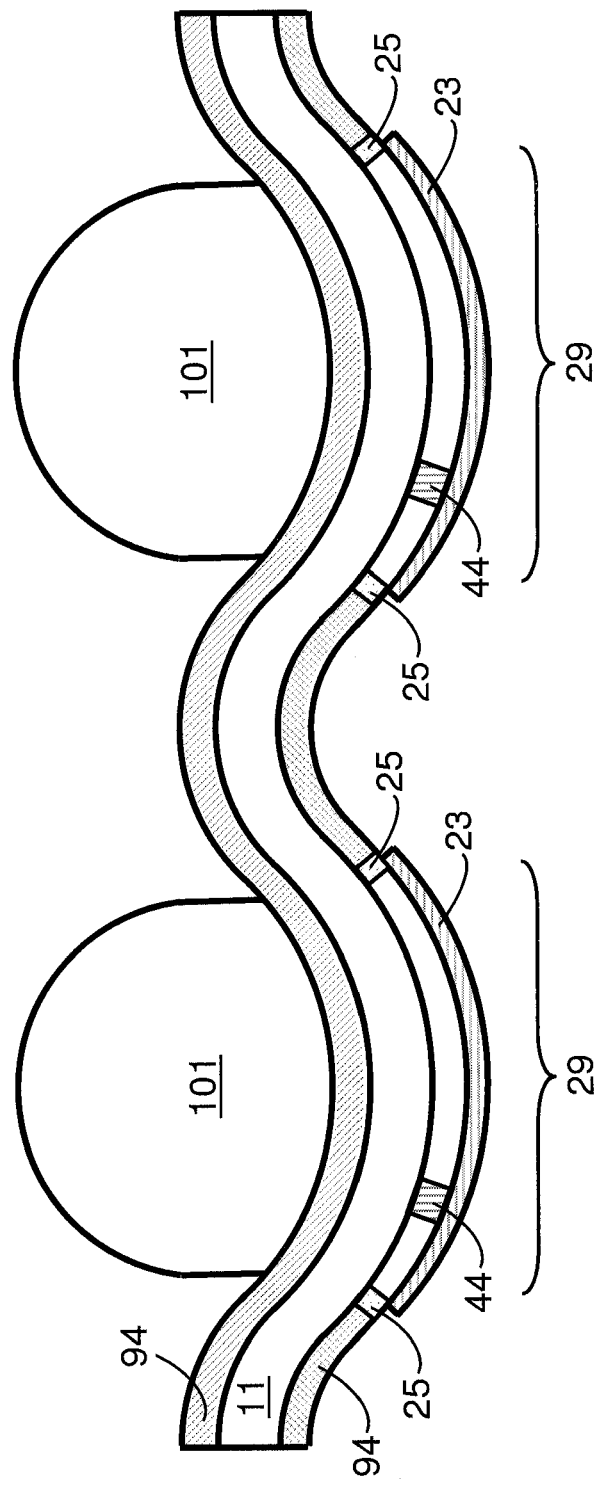
FIG. 19 provides a cross-sectional view of an example application of the coupling device of FIG. 9 in a system with an array of lenses on a curved light-guide.

FIG. 19 depicts an example array system designed with a curved light-guiding layer 11 to follow the curved focal plane of the focusing lenses 101. A coupling device design similar to that of FIG. 9 is employed in this example, although many of the other designs can also be implemented with a curved light-guide. Cladding layers 94 are shown on the exposed portions of the light-guiding layer 11, but these could also be left uncovered so that air serves as the cladding material. A narrow light-guide can be utilized to minimize light loss from the light-guide curvature.

The array systems described above can be made to flex and bend if they are produced using sufficiently thin and flexible materials, or if they are segmented in locations to allow flexing. Because the fluid tracking layer provides automatic tracking of the focused light from each focusing element, each focusing element can be differently oriented without compromising performance of the entire collector. Thus, flexible or foldable concentrating optical energy collection systems are enabled. Such systems can be rolled or folded for portability and then unrolled or unfolded for use, with no need to be held flat or rigid during operation.

Figure 20:
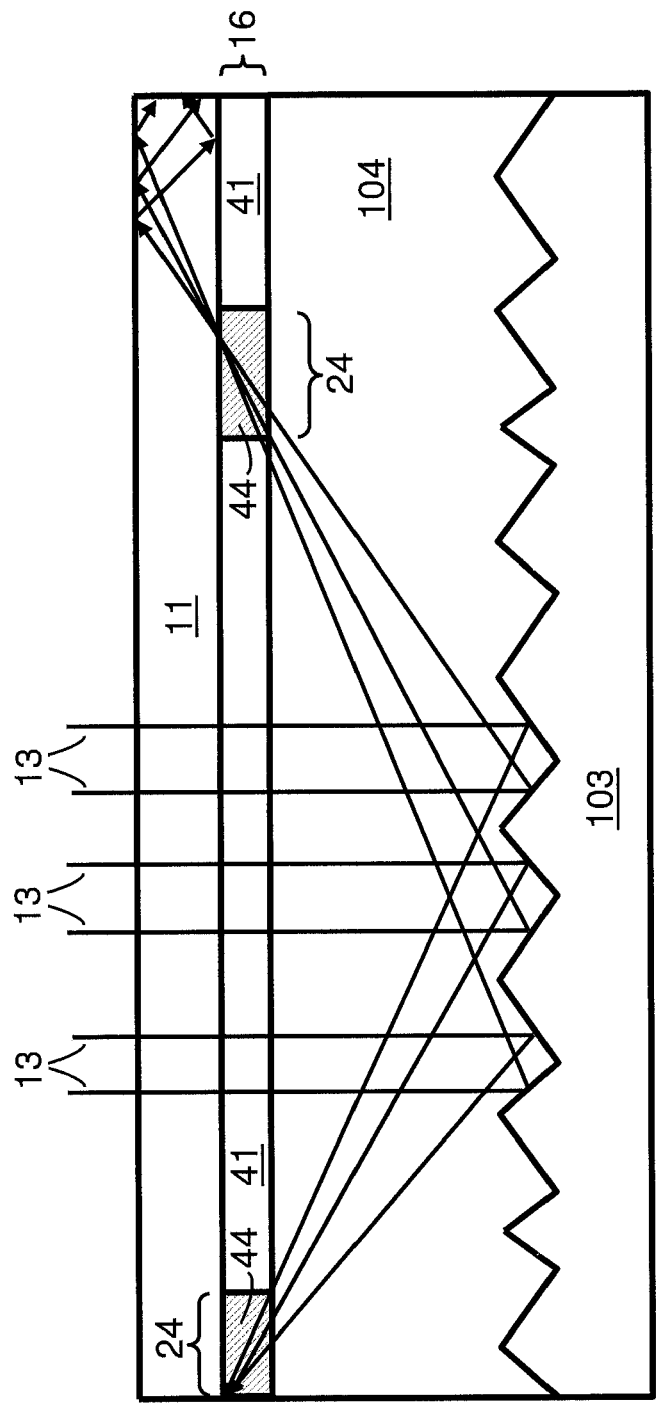
FIG. 20 provides a cross-sectional view of an example system with a focusing sawtooth mirror surface that provides both light focusing and light ray reorientation.

FIG. 20 shows a design in which both focusing and reorientation are performed by a single optical surface 103, so that the light rays 13 arrive at the tracking layer 16 both focused into a small area and oriented for light-guide coupling. The focusing and reorienting element 103 is a tailored sawtooth reflecting surface, which is embedded in a high-refractive-index material 104 to provide a continuous high-refractive-index pathway for reflected light rays 13 to enter the light-guiding layer 11 in coupling regions 24. While the coupling regions 24 in FIG. 20 are shown to include a coupling droplet 44 contained within a cladding fluid layer 41, as in FIG. 8, any of the coupling region structures described herein, and the layers used to form them, can be implemented as in FIG. 20 with a single focusing and reorienting element 103. Other optical designs are also possible to provide combined focusing and reorientation utilizing reflective, refractive, and/or diffractive elements.

Array System Variations for Increased Angular Acceptance

Figure 21:
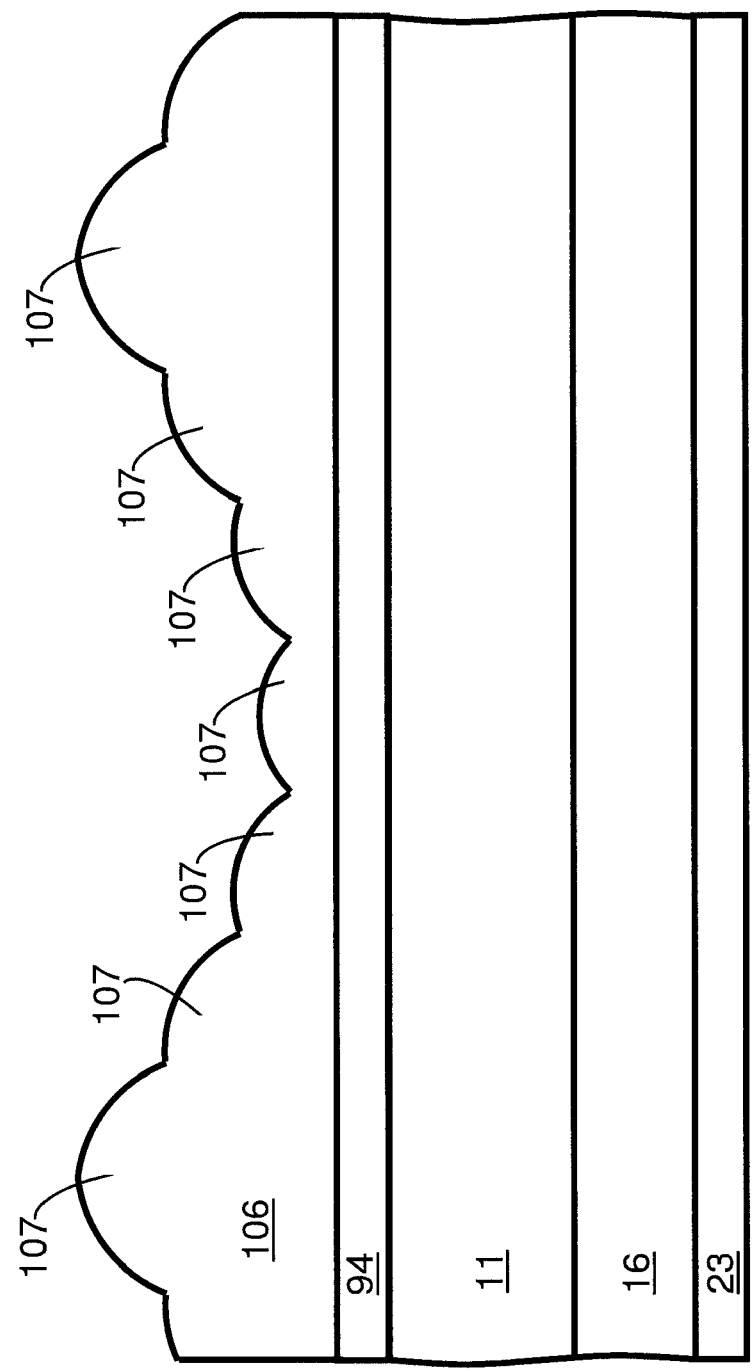
FIG. 21 provides a cross-sectional view of a system in which lenses that are arrayed on a curved surface focus light onto a common planar light-guide and tracking layer.

The focusing optics may only produce a well-defined focal spot over a limited range of incident light angles. For solar light collection, a very wide range of acceptance angles is desired, especially along the east-west axis, across which the sun traverses a wide angular range each day. A wide range of acceptance angles may also be desired in other applications. In order to increase the range of incident angles over which direct-beam light can be collected, the angular orientation of the focusing elements can be varied across an array. FIG. 21 shows an example in which single-surface lenses 107 are arrayed along a curved surface to form a lens array 106 so that the optical axes of the lenses vary, thus extending the angular acceptance range of the entire array 106. As the incident angle of light varies, different lenses 107 will receive a different intensity of illumination based upon their orientation to the angle of incidence. The curvature of the surface ensures that each individual lens will not be shadowed by other elements when it is aligned to receive maximum light (when the angle of incident light coincides with the optical axis of the lens). This arrangement of lenses can be repeated in an array to tile a surface area, as shown in FIG. 21.

The focal length of the lenses along the surface can be varied so that the focal point of all the lenses lie in the same plane, permitting the use of a planar light-guiding layer 11 and tracking layer 16. The surface curvature can be applied in one dimension only, or in two dimensions if desired. FIG. 21 shows seven lens elements 107 arrayed along the curved surface, but the number of elements can be made larger or smaller as desired. The example shown in FIG. 21 extends the angular acceptance of the focusing system in a symmetric fashion centered on incidence perpendicular to the light-guiding structure, but asymmetric lens arrangements may also be produced, if desired, in order to match the angular variation of the light source. FIG. 21 shows the focusing array variation implemented with single-surface lenses, but the same principles can be applied with other focusing schemes, including reflecting focusing mirrors and designs that focus light through multiple optical elements. In general, any of the light-guiding structures described herein can be paired with the array 106 of focusing elements 107 shown in FIG. 21.

Figure 22:
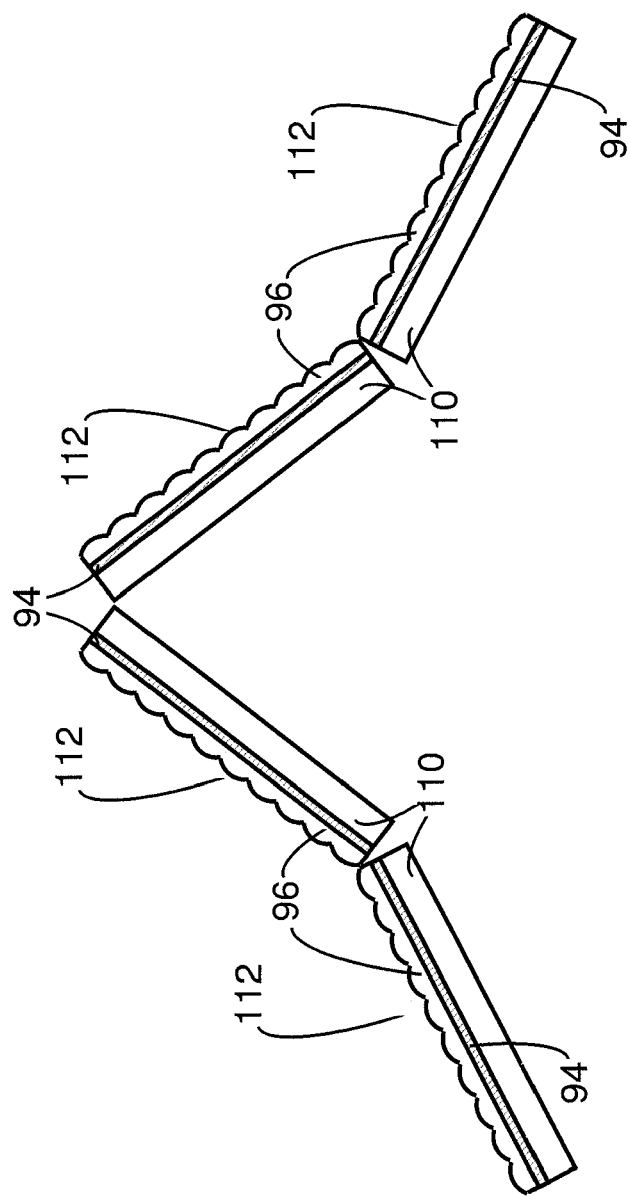
FIG. 22 provides a cross-sectional view of a system in which segments of a planar concentrator are positioned at varying angles.

Another approach to increasing the range of angular incidence over which light can be collected is to vary the orientation of the entire system, including the plane of the light-guiding layer. FIG. 22 shows an example in which four planar segments 112 of an example planar light-guide concentrator system are deployed at varying orientations. Each of the four segments 112 includes a lens array 96, a cladding layer 94, and a light-guiding and tracking portion 110. The four segments 112 are differently oriented, so that each one accepts light from a different range of incidence angles with minimal shadowing of each other. The different segments can be connected by a bend in a continuous light-guide or by an optical element such as a prism or mirror that connects the light-guides of two segments. Alternatively, receiving elements (such as photovoltaic cells and associated optics) can be placed in the joining locations. A larger or smaller number of segments can be used as desired. This orientation of segments can be repeated in an array.

Figure 23:
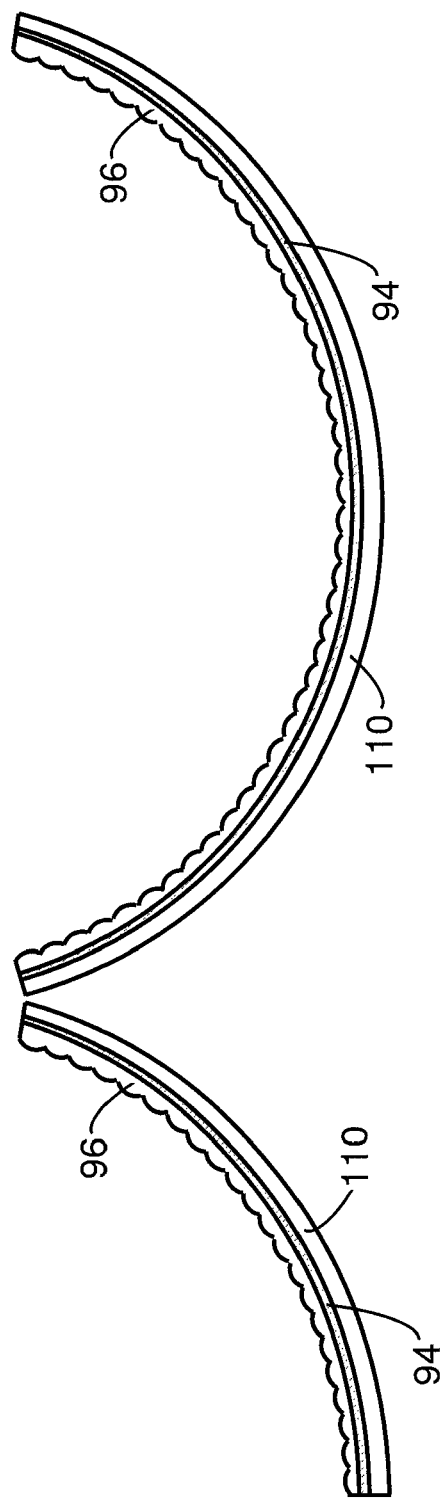
FIG. 23 provides a cross-sectional view of a system in which a concentrator system is formed in a curved shape.

Another variation is to use a continuous curved array rather than a segmented planar array, as shown in FIG. 23. The scale over which the segmentation or curvature of the array takes place can be chosen at will, as the optical effects are independent of scale as long as any curvature is small enough that large light-guide propagation loss is not introduced. The curvature or segmentation can be applied in one dimension only, or in two dimensions if desired. The optical properties of the focusing elements of array 96 can also be varied across the array to account for varying angles of incident light based on shadowing effects along the array. While FIGS. 22 and 23 show systems with light-guiding layers which have varying orientations throughout implemented with single-surface lenses, the designs can be applied with other focusing schemes as well.

Figure 24:
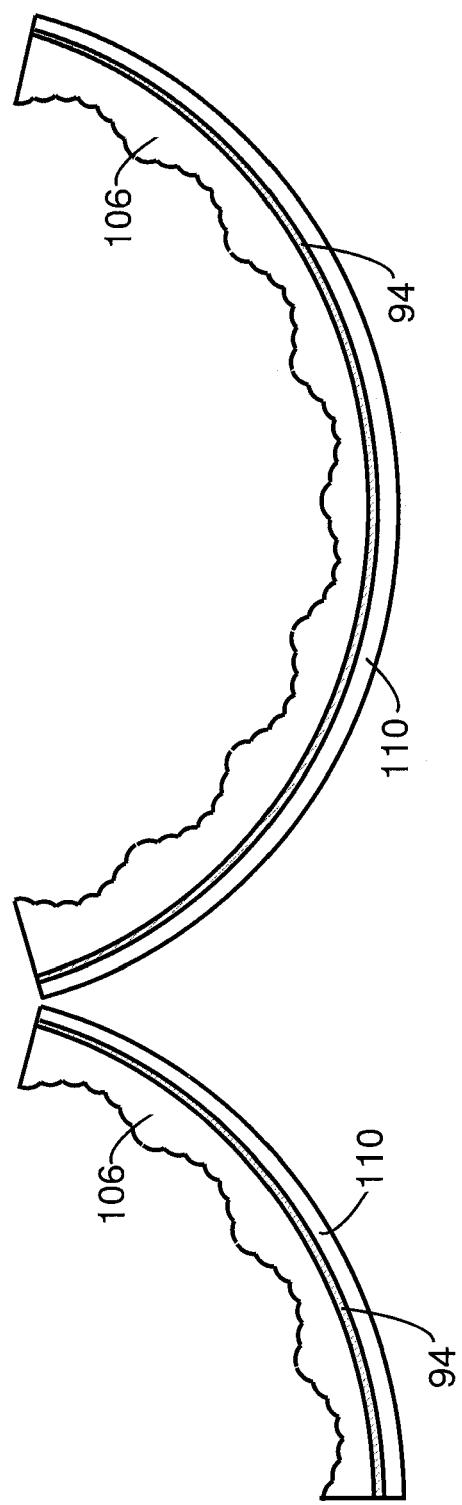
FIG. 24 provides a cross-sectional view of a system in which the position and angle of the concentrating lenses is varied on a small scale and the entire concentrator system is formed in a curved shape.

This approach can also be combined with that of FIG. 21. FIG. 24 shows an example where lenses of lens arrays 106 are present on a surface with small-scale local curvature as well as larger-scale curvature that follows the curvature of the light-guiding and tracking layers 110. The small-scale curvature shown in FIG. 21 could also be combined with the segmented planar light-guide design described earlier in this section and illustrated in FIG. 22. FIG. 24 shows the use of a uniform small-scale variation in lens arrangement across the larger array, however the small-scale curvature and lens arrangement can also be tailored depending upon position within the larger array, so that the angular acceptance enhancement provided by the small-scale variation is, in each location, optimized for the locally-available angles of incident light.

The principles described in this section allow the light collection efficiency of the system as a function of incidence angle to be tailored as desired. For example, in a solar energy system, the design can be optimized to collect the maximum total sunlight over the course of a day. As another example, the design can be optimized to collect sunlight with an efficiency that is close to uniform over a broad range of angles, so that light incident on the receiving element is held approximately constant.

Integration of Array into a Complete Optical Energy Collection System

To complete an optical energy collection system, the light-guide or light-guiding layer of a tracking-concentrating array is connected to a receiver such as a photovoltaic cell, thermal load, or other light-gathering device. Additional optical elements may be placed between the light-guide and the light-gathering device to provide further concentration or to bend the light rays or provide other functions to match the light output from the light-guide to the receiver or receivers. This system can then either be mounted on a low-cost mechanical tracker that provides coarse alignment to the light source, or deployed without a tracker altogether. The system may be used in sunlight as a solar energy collection system. By eliminating the need for precise tracking, the disclosed devices enable solar concentration systems with greatly reduced complexity and cost. The system may also be used with other light sources, including laser beams used to transfer power from a remote location.

Figure 25:
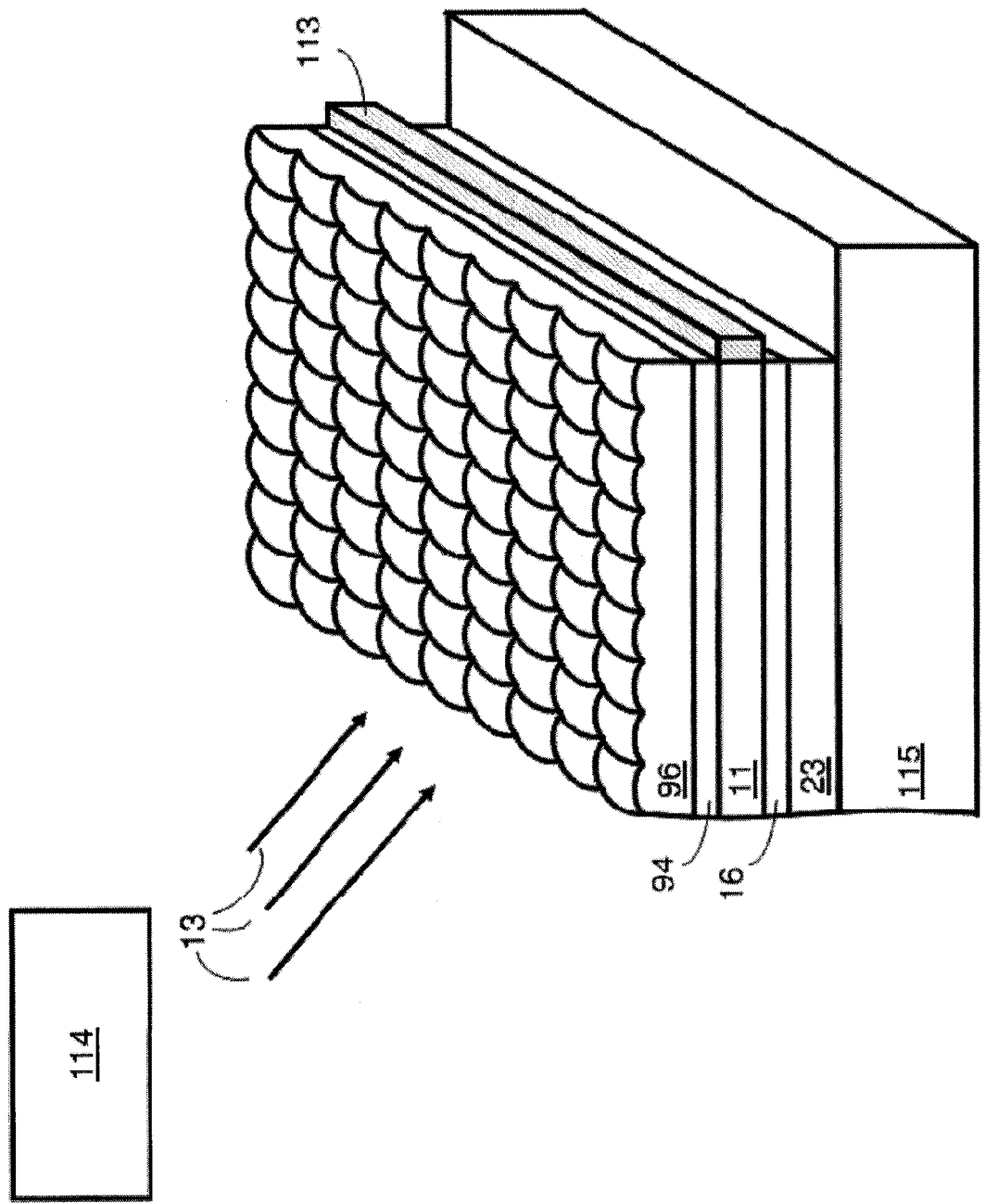
FIG. 25 provides a perspective view of an optical energy collection system featuring a planar array of lenses to focus light from a light source and a receiver mounted on the edge of the light-guide. The system is attached to a supporting mount that may feature a mechanical tracking capability.

FIG. 25 is a perspective view of an exemplary optical energy collection system. This example uses a planar array of lenses 96 to focus light rays 13 from a light source 114 (e.g., the sun, a laser beam, or another light source). The fluidic tracking layer 16 in combination with the reorienting layer 23 serve to capture the focused light in the light-guide 11. A receiver 113 is mounted on the edge of the light-guide to receive the guided light. The receiver may be a photovoltaic cell or another receiving element. The entire structure is mounted on a supporting element 115 which may include mechanical tracking features to tilt the structure toward the incident light in order to improve light capture.

Figure 26:
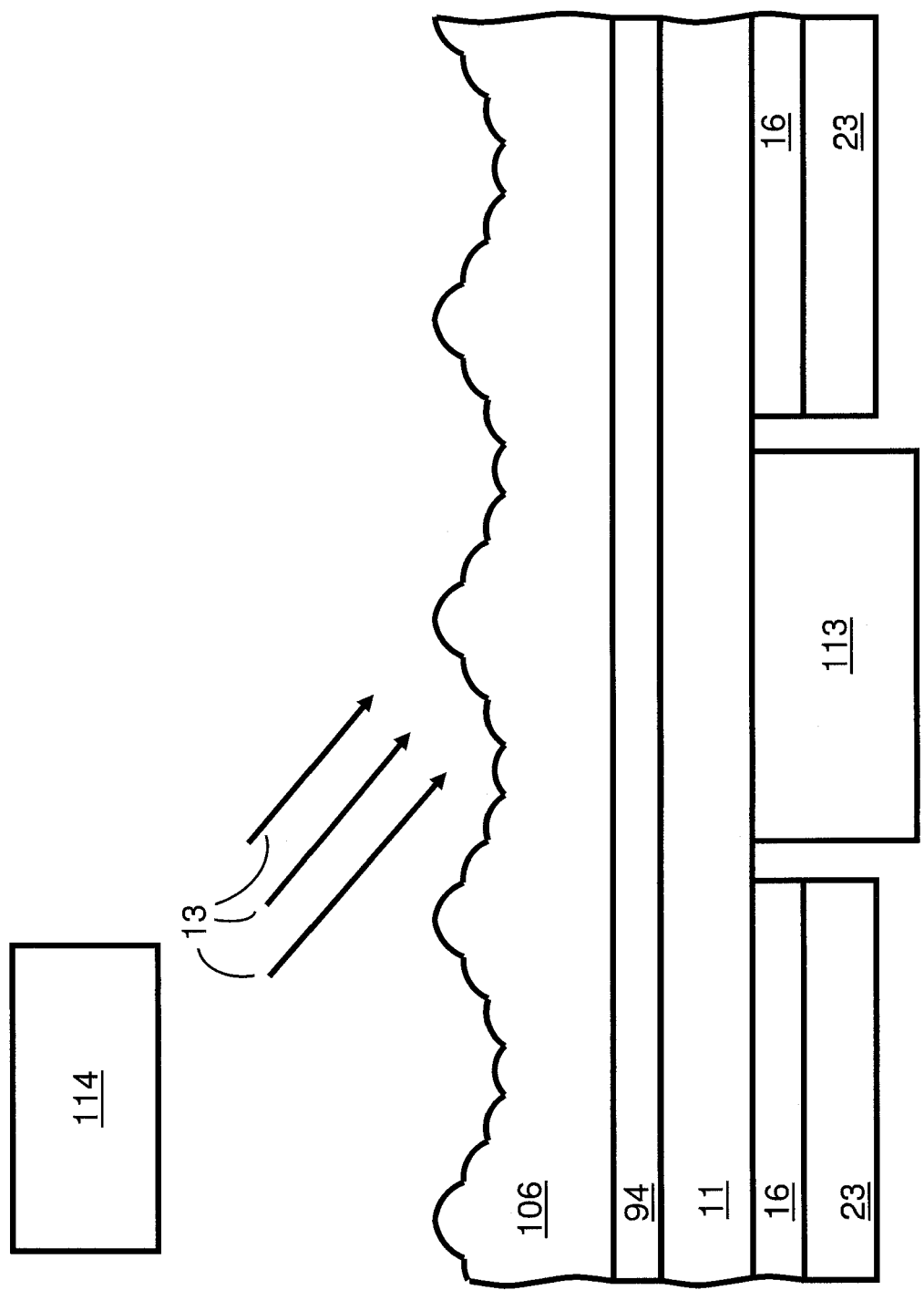
FIG. 26 provides a cross-sectional view of an optical energy collection system employing lenses arrayed on a curved surface and with a receiver mounted on the bottom face of the light-guide.

FIG. 26 shows a cross-sectional view of a second exemplary optical energy collection system. This example uses the curved lens array of FIG. 21 to capture light rays 13 from light source 114. The fluidic tracking layer 16 in combination with the reorienting layer 23 serve to capture the focused light in the light-guide 11. In this example, receiver 113 is mounted on the bottom face of the light-guide in order to receive the guided light. The fluidic layer 16 and reorienting layer 23 are interrupted in the location of the receiver. As before, the receiver may be a photovoltaic cell or another receiving element. It may also feature additional optical elements to further confine or direct the light. Although the receiver is mounted on the bottom face of the light-guide in FIG. 26, it may also be mounted on the top face. In that case, the lens array 106 and upper cladding 94 must be interrupted in the location of the receiver so that the receiver may be attached directly onto the light-guide Fluid Motive Force Variations The thermocapillary effect is only one of a number of mechanisms that can be used to move liquids within microfluidic chambers. It is a very convenient mechanism to use in cases where a high light intensity is present (as when concentrating sunlight), because a strong temperature gradient can be automatically generated at the edge of the focal spot that can provide automatic light tracking. Other mechanisms are also possible, and may be preferred in other applications where the light intensity is lower or where it is desired to provide at-will control over coupling (e.g. switching coupling on and off) rather than a simple light-tracking function. Electrowetting and dielectrophoresis techniques move liquid in response to an applied electric field. These techniques could be utilized in the tracking chambers described herein by providing an array of electrodes embedded in the chamber wall and by applying voltage to specific electrodes to affect the desired fluid movement. Depending on the chamber design, the electrodes may need to be made of a conducting material that is transparent to the incident light, such as indium tin oxide. In an array of chambers on a common light-guide, corresponding electrodes could be wired in parallel so that fluid motion occurs in all chambers in unison. An electronic control system would provide the required voltage signals to the electrodes. Such devices could be used to control light coupling both in and out of a light-guide as desired.

A number of implementations have been described. Nevertheless, as will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A light-guiding structure, comprising:
a first solid layer, wherein the first solid layer is transparent;
a second solid layer; and
a fluid light-tracking layer interposed between the first and second solid layers, wherein the fluid light-tracking layer contains a first fluid and a second fluid, wherein the first fluid and the second fluid are immiscible, wherein at least a portion of the first fluid comprises a coupling region located at a local temperature maximum within the fluid light-tracking layer, wherein a light beam incident on the light-guiding structure and striking the coupling region is deflected by an element of the light-guiding structure at an angle sufficient to confine at least a portion of the deflected light beam within the light-guiding structure as the deflected light beam propagates through the light-guiding structure, wherein the local temperature maximum is the result of localized absorption of a portion of the light beam incident on the light-guiding structure, wherein the coupling region self-aligns with the light beam incident on the light-guiding structure, and wherein a cross-sectional area of the coupling region is less than 10% of a fluid light-tracking layer cross-section.

2. The light-guiding structure of claim 1, wherein the first fluid has a first refractive index, the second fluid has a second refractive index which is less than the first refractive index, and the first solid layer has a third refractive index which is greater than the second refractive index.

3. The light-guiding structure of claim 1, wherein a surface of at least one of the first solid layer or the second solid layer is coated with a layer to control fluid wetting.

4. The light-guiding structure of claim 1, wherein the first fluid is contained within a plurality of chambers.

5. The light-guiding structure of claim 1, wherein the second fluid is contained within a plurality of chambers.

6. The light-guiding structure of claim 1, wherein the first fluid and the second fluid are each selected from the group of materials consisting of aqueous solutions, water-soluble fluids, hydrocarbon oils, silicone oils, and fluorocarbon oils.

7. The light-guiding structure of claim 1, wherein the light-guiding structure is planar.

8. The light-guiding structure of claim 1, wherein the light-guiding structure is curved.

9. The light-guiding structure of claim 1, wherein the light beam incident on the light-guiding structure is comprised of a focused light beam.

10. The light-guiding structure of claim 1, wherein the first solid layer is a light-guiding layer, wherein the second solid layer is a light-reorienting layer, wherein the light-reorienting layer deflects the light beam incident on the light-guiding structure into the light-guiding layer at an angle sufficient to confine at least a portion of the deflected light beam within the light-guiding layer as the deflected light beam propagates through the light-guiding layer, wherein the first fluid is a coupling fluid and comprises a coupling fluid layer adjacent to the light-reorienting layer, wherein the second fluid is a cladding fluid and comprises a cladding fluid layer adjacent to the light-guiding layer and adjacent to the coupling fluid layer, and wherein the cladding fluid layer further comprises an aperture formed at the coupling region when the light beam is incident on the light-guiding structure, wherein the aperture is filled with the coupling fluid when the light beam is incident on the light-guiding structure, and wherein the aperture is eliminated from the cladding fluid layer when the light beam is not incident on the light-guiding structure.

11. The light-guiding structure of claim 10, wherein the light-reorienting layer is comprised of a light-scattering material.

12. The light-guiding structure of claim 11, wherein the light-reorienting layer is reflective and comprised of a sawtooth mirror.

13. The light-guiding structure of claim 11, wherein the light-reorienting layer is transmissive and comprised of a prism array.

14. The light-guiding structure of claim 11, wherein the light-reorienting layer is transmissive and comprised of a light-scattering material.

15. The light-guiding structure of claim 11, wherein the first fluid has a first refractive index, the second fluid has a second refractive index which is less than the first refractive index, and the first solid layer has a third refractive index which is greater than the second refractive index.

16. The light-guiding structure of claim 11, wherein a surface of at least one of the first solid layer or the second solid layer is coated with a layer to control fluid wetting.

17. The light-guiding structure of claim 11, wherein the first fluid is contained within a plurality of chambers.

18. The light-guiding structure of claim 11, wherein the second fluid is contained within a plurality of chambers.

19. The light-guiding structure of claim 11, wherein the first fluid and the second fluid are each selected from the group of materials consisting of aqueous solutions, water-soluble fluids, hydrocarbon oils, silicone oils, and fluorocarbon oils.

20. The light-guiding structure of claim 11, wherein the light-guiding structure is planar.

21. The light-guiding structure of claim 11, wherein the light-guiding structure is curved.

22. The light-guiding structure of claim 11, wherein the light beam incident on the light-guiding structure is comprised of a focused light beam.

23. The light-guiding structure of claim 1, wherein the second solid layer is a light-reorienting layer, wherein the first fluid is a coupling fluid and comprises a coupling fluid layer adjacent to the first solid layer, wherein the second fluid is a cladding fluid and comprises a cladding fluid layer adjacent to the light-reorienting layer and adjacent to the coupling fluid layer, wherein the light-reorienting layer deflects the light beam incident on the light-guiding structure into the coupling fluid layer at an angle sufficient to confine at least a portion of the deflected light beam within the light-guiding structure as the deflected light beam propagates through the light-guiding structure, and wherein the cladding fluid layer further comprises an aperture formed at the coupling region when the light beam is incident on the light-guiding structure, wherein the aperture is filled with the coupling fluid when the light beam is incident on the light-guiding structure, and wherein the aperture is eliminated from the cladding fluid layer when the light beam is not incident on the light-guiding structure.

24. The light-guiding structure of claim 23, wherein the coupling fluid layer in combination with the first solid layer guide the light beam through a bulk portion of the first solid layer and through a bulk portion of the coupling fluid layer.

25. The light-guiding structure of claim 23, wherein the coupling fluid layer guides the light beam through a bulk portion of the coupling fluid layer.

26. The light-guiding structure of claim 23, wherein the light-reorienting layer is comprised of a light-scattering material.

27. The light-guiding structure of claim 23, wherein the light-reorienting layer is reflective and comprised of a saw-tooth mirror.

28. The light-guiding structure of claim 23, wherein the light-reorienting layer is transmissive and comprised of a prism array.

29. The light-guiding structure of claim 23, wherein the light-reorienting layer is transmissive and comprised of a light-scattering material.

30. The light-guiding structure of claim 23, wherein the first fluid has a first refractive index, the second fluid has a second refractive index which is less than the first refractive index, and the first solid layer has a third refractive index which is greater than the second refractive index.

31. The light-guiding structure of claim 23, wherein a surface of at least one of the first solid layer or the second solid layer is coated with a layer to control fluid wetting.

32. The light-guiding structure of claim 23, wherein the first fluid is contained within a plurality of chambers.

33. The light-guiding structure of claim 23, wherein the second fluid is contained within a plurality of chambers.

34. The light-guiding structure of claim 23, wherein the first fluid and the second fluid are each selected from the group of materials consisting of aqueous solutions, water-soluble fluids, hydrocarbon oils, silicone oils, and fluorocarbon oils.

35. The light-guiding structure of claim 23, wherein the light-guiding structure is planar.

36. The light-guiding structure of claim 23, wherein the light-guiding structure is curved.

37. The light-guiding structure of claim 23, wherein the light beam incident on the light-guiding structure is comprised of a focused light beam.

38. The light-guiding structure of claim 1, wherein the first solid layer is a light-guiding layer, wherein the second solid layer is a light-reorienting layer, wherein the light-reorienting layer deflects the light beam incident on the light-guiding structure into the light-guiding layer at an angle sufficient to confine at least a portion of the deflected light beam within the light-guiding layer as the deflected light beam propagates through the light-guiding layer, wherein the second fluid is a cladding fluid and comprises a cladding fluid layer adjacent to the light-guiding layer and adjacent to the light-reorienting layer, wherein the first fluid is a coupling fluid, wherein the coupling region comprises a droplet of the coupling fluid, wherein the droplet of the coupling fluid is within the cladding fluid layer and free to move within the cladding fluid layer, and wherein the droplet of the coupling fluid is in contact with both the light-guiding layer and the light-reorienting layer.

39. The light-guiding structure of claim 38, wherein the light-reorienting layer is comprised of a light-scattering material.

40. The light-guiding structure of claim 38, wherein the light-reorienting layer is reflective and comprised of a saw-tooth mirror.

41. The light-guiding structure of claim 38, wherein the light-reorienting layer is transmissive and comprised of a prism array.

42. The light-guiding structure of claim 38, wherein the light-reorienting layer is transmissive and comprised of a light-scattering material.

43. The light-guiding structure of claim 38, wherein the first fluid has a first refractive index, the second fluid has a second refractive index which is less than the first refractive index, and the first solid layer has a third refractive index which is greater than the second refractive index.

44. The light-guiding structure of claim 38, wherein a surface of at least one of the first solid layer or the second solid layer is coated with a layer to control fluid wetting.

45. The light-guiding structure of claim 38, wherein the first fluid is contained within a plurality of chambers.

46. The light-guiding structure of claim 38, wherein the second fluid is contained within a plurality of chambers.

47. The light-guiding structure of claim 38, wherein the first fluid and the second fluid are each selected from the group of materials consisting of aqueous solutions, water-soluble fluids, hydrocarbon oils, silicone oils, and fluorocarbon oils.

48. The light-guiding structure of claim 38, wherein the light-guiding structure is planar.

49. The light-guiding structure of claim 38, wherein the light-guiding structure is curved.

50. The light-guiding structure of claim 38, wherein the light beam incident on the light-guiding structure is comprised of a focused light beam.

51. The light-guiding structure of claim 1, wherein the second fluid comprises a layer adjacent to the first solid layer and adjacent to the second solid layer, wherein the coupling region comprises a droplet of the first fluid, wherein the droplet of the first fluid is within the second fluid and free to move within the second fluid, and wherein the droplet of the first fluid contains reorienting elements that deflect the light beam incident on the light-guiding structure into the layer of the second fluid at an angle sufficient to confine at least a portion of the deflected light beam within the light-guiding structure as the deflected light beam propagates through the light-guiding structure.

52. The light-guiding structure of claim 51, wherein the first solid layer is a light-guiding layer, wherein the second fluid is a cladding fluid and comprises a cladding fluid layer adjacent to the light-guiding layer and adjacent to the second solid layer, wherein the first fluid is a coupling fluid, and wherein the droplet of the coupling fluid deflects the light beam at an angle sufficient to confine at least a portion of the deflected light beam within the light-guiding layer.

53. The light-guiding structure of claim 51, wherein the second fluid layer in combination with the first solid layer guide the light beam through a bulk portion of the first solid layer and through a bulk portion of the second fluid layer.

54. The light-guiding structure of claim 51, wherein the second fluid layer guides the light beam through a bulk portion of the second fluid layer.

55. The light-guiding structure of claim 51, wherein the second solid layer is a light-absorbing layer.

56. The light-guiding structure of claim 51, further comprising a light-absorbing layer, wherein the light absorbing layer is adjacent to the second solid layer.

57. The light-guiding structure of claim 51, wherein the first fluid has a first refractive index, the second fluid has a second refractive index which is less than the first refractive index, and the first solid layer has a third refractive index which is greater than the second refractive index.

58. The light-guiding structure of claim 51, wherein a surface of at least one of the first solid layer or the second solid layer is coated with a layer to control fluid wetting.

59. The light-guiding structure of claim 51, wherein the first fluid is contained within a plurality of chambers.

60. The light-guiding structure of claim 51, wherein the second fluid is contained within a plurality of chambers.

61. The light-guiding structure of claim 51, wherein the first fluid and the second fluid are each selected from the group of materials consisting of aqueous solutions, water-soluble fluids, hydrocarbon oils, silicone oils, and fluorocarbon oils.

62. The light-guiding structure of claim 51, wherein the light-guiding structure is planar.

63. The light-guiding structure of claim 51, wherein the light-guiding structure is curved.

64. The light-guiding structure of claim 51, wherein the light beam incident on the light-guiding structure is comprised of a focused light beam.

\* \* \* \* \*